United States Patent
Yoshida et al.

(10) Patent No.: US 11,100,603 B2
(45) Date of Patent: Aug. 24, 2021

(54) CONTROLLER

(71) Applicant: FANUC CORPORATION, Yamanashi (JP)

(72) Inventors: Kouhei Yoshida, Yamanashi-ken (JP); Hideo Kobayashi, Yamanashi-ken (JP); Hiroyuki Suwa, Yamanashi-ken (JP); Junichi Sakamoto, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/173,199

(22) Filed: Oct. 29, 2018

(65) Prior Publication Data

US 2019/0130520 A1    May 2, 2019

(30) Foreign Application Priority Data

Oct. 31, 2017 (JP) .............................. JP2017-210466

(51) Int. Cl.
*G06T 1/20* (2006.01)
*G09G 3/00* (2006.01)

(52) U.S. Cl.
CPC ................ *G06T 1/20* (2013.01); *G09G 3/00* (2013.01)

(58) Field of Classification Search
CPC ................................... G06T 1/20; G09G 3/00
See application file for complete search history.

(56) References Cited

U.S. PATENT DOCUMENTS

| | | | |
|---|---|---|---|
| 2008/0007895 A1 | 1/2008 | Shimoirisa et al. | |
| 2009/0055567 A1* | 2/2009 | Chen ....................... | G06F 1/185 |
| | | | 710/302 |
| 2011/0069442 A1* | 3/2011 | Chen ....................... | G06F 1/181 |
| | | | 361/679.33 |
| 2011/0081861 A1* | 4/2011 | Kuo ........................ | A42B 3/30 |
| | | | 455/41.3 |
| 2012/0011293 A1* | 1/2012 | Cheng .................... | G06F 1/1632 |
| | | | 710/303 |
| 2014/0345492 A1* | 11/2014 | Fujito .................... | H02M 7/003 |
| | | | 105/61 |
| 2016/0106214 A1* | 4/2016 | Hagen .................. | H05K 5/0204 |
| | | | 361/679.21 |

FOREIGN PATENT DOCUMENTS

| | | |
|---|---|---|
| CN | 106371520 A | 2/2017 |
| JP | 53131559 U | 10/1978 |

(Continued)

OTHER PUBLICATIONS

English Abstract and Machine Translation for Japanese Publication No. H09-034374 A, published Feb. 7, 1997, 9 pgs.

(Continued)

*Primary Examiner* — Grace Q Li

(74) *Attorney, Agent, or Firm* — Fredrikson & Byron, P.A.

(57) ABSTRACT

A controller is attached to a back face of a display device. The controller includes: a housing; a control unit removably accommodated in a slot formed in the housing and configured to control the display device; a backboard provided inside the housing on the interior side with respect to the direction of insertion of the control unit and connected to the control unit; and a second connector connected to a first connector provided for the display device to establish connection between the backboard and the display device.

5 Claims, 27 Drawing Sheets

(56) References Cited

FOREIGN PATENT DOCUMENTS

| | | | |
|---|---|---|---|
| JP | 6343490 U | 3/1988 | |
| JP | 418491 U | 2/1992 | |
| JP | 786774 A | 3/1995 | |
| JP | 934374 A | 2/1997 | |
| JP | 969004 A | 3/1997 | |
| JP | 10161843 A | 6/1998 | |
| JP | 200071144 A | 3/2000 | |
| JP | 200272917 A | 3/2002 | |
| JP | 2007123666 A | 5/2007 | |
| JP | 2007333547 A | 12/2007 | |
| JP | 201038608 A | 2/2010 | |
| JP | 2014142400 A | 8/2014 | |
| JP | 2015192883 A | 11/2015 | |
| JP | 201792164 A | 5/2017 | |
| WO | 2016019517 A1 | 2/2016 | |

OTHER PUBLICATIONS

English Abstract and Machine Translation for Japanese Publication No. H10-161843 A, published Jun. 19, 1998, 6 pgs.

English Abstract and Machine Translation for Japanese Publication No. 2010-038608 A, published Feb. 18, 2010, 10 pgs.

English Abstract and Machine Translation for Japanese Publication No. 2002-072917 A, published Mar. 12, 2002, 5 pgs.

English Abstract and Machine Translation for Japanese Publication No. 2000-071144 A, published mar. 7, 2000, 6 pgs.

English Machine Translation for Japanese Publication No. S53-131559 U, published Oct. 18, 1978, 3 pgs.

English Machine Translation for Japanese Publication No. S63-043490 U, published Mar. 23, 1988, 3 pgs.

English Abstract and Machine Translation for Japanese Publication No. 2017-092164, published May 25, 2017, 8 pgs.

English Machine Translation for Japanese Publication No. H04-018491 U, published Feb. 17, 1992, 4 pgs.

English Abstract and Machine Translation for Japanese Publication No. H09-069004 A, published Mar. 11, 1997, 11 pgs.

English Abstract and Machine Translation for Japanese Publication No. 2007-123666 A, published May 17, 2007, 5 pgs.

English Abstract and Machine Translation for Japanese Publication No. 2015-192883 A, published May 11, 2015, 64 pgs.

English Abstract and Machine Translation for Japanese Publication No. 2014-142400 A, published Aug. 7, 2014, 6 pgs.

English Abstract for Japanese Publication No. 2007333547 A, published Dec. 27, 2007, 2 pgs.

English Abstract and Machine Translation for Japanese Publication No. 07-086774 A, published Mar. 31, 1995, 6 pgs.

English Abstract and Machine Translation for Chinese Publication No. CN106371520A, published Feb. 1, 2017, 12 pgs.

* cited by examiner

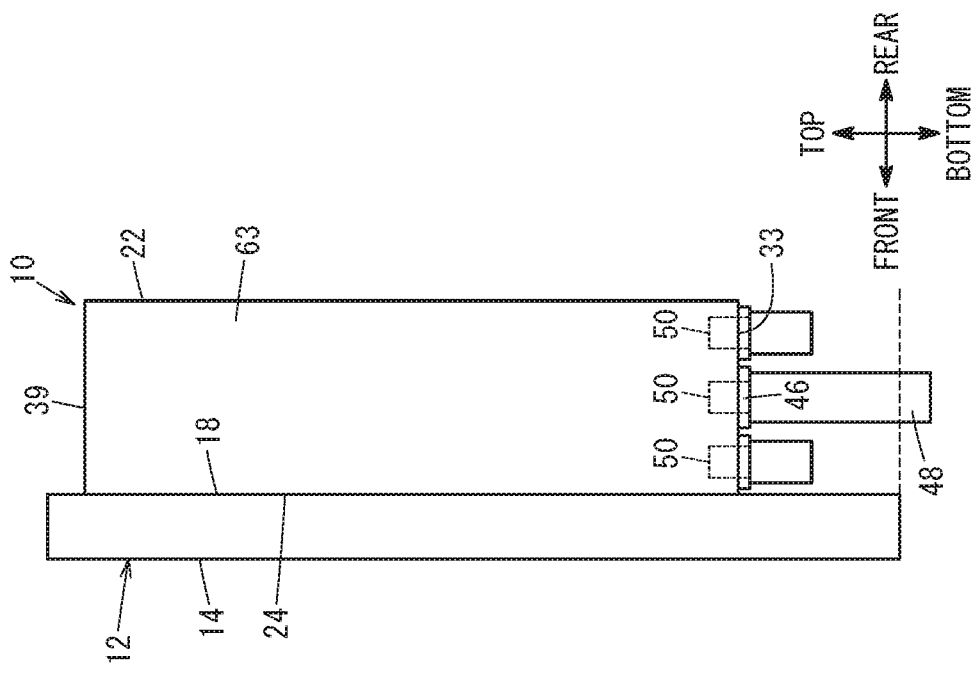
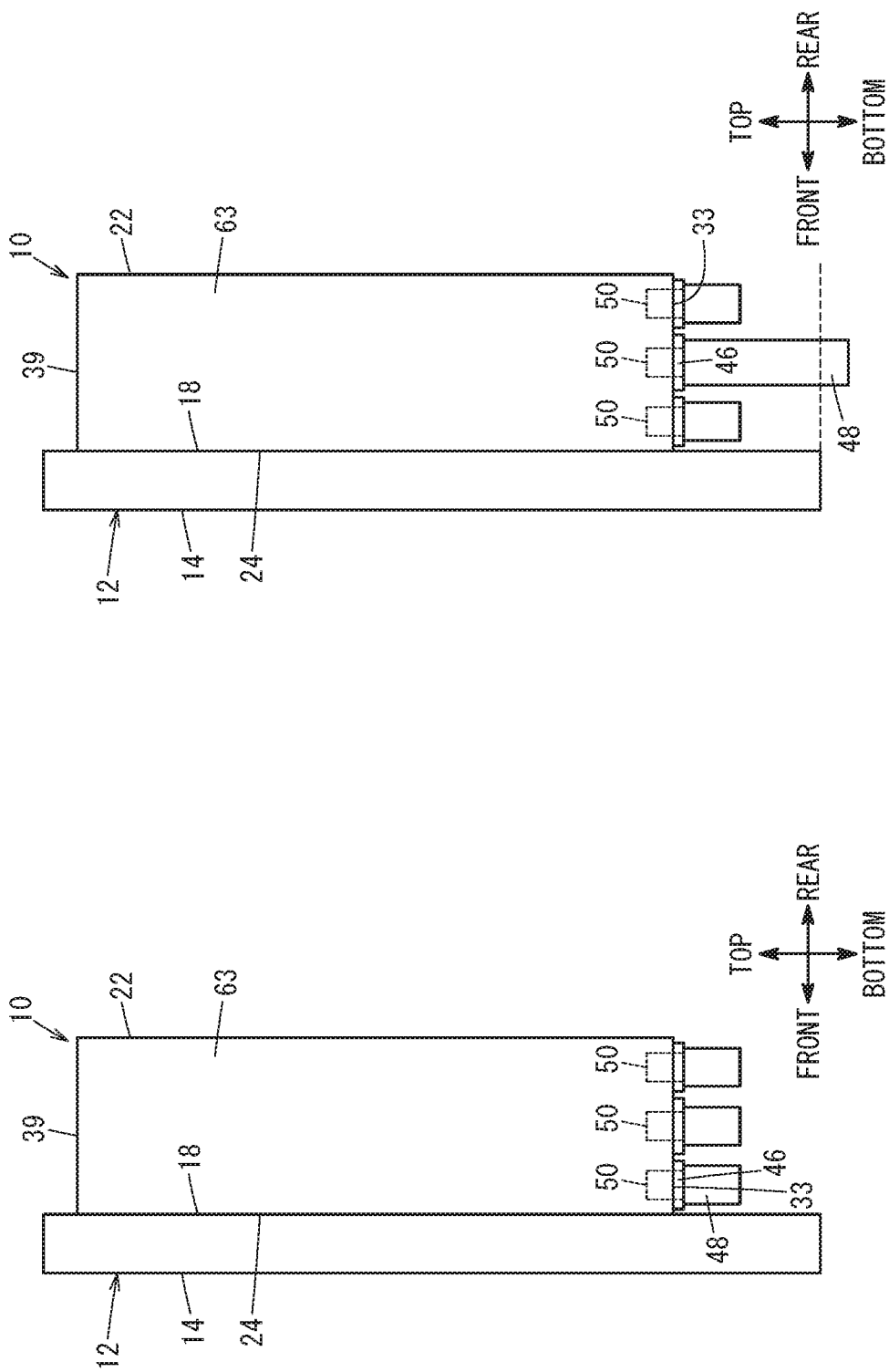

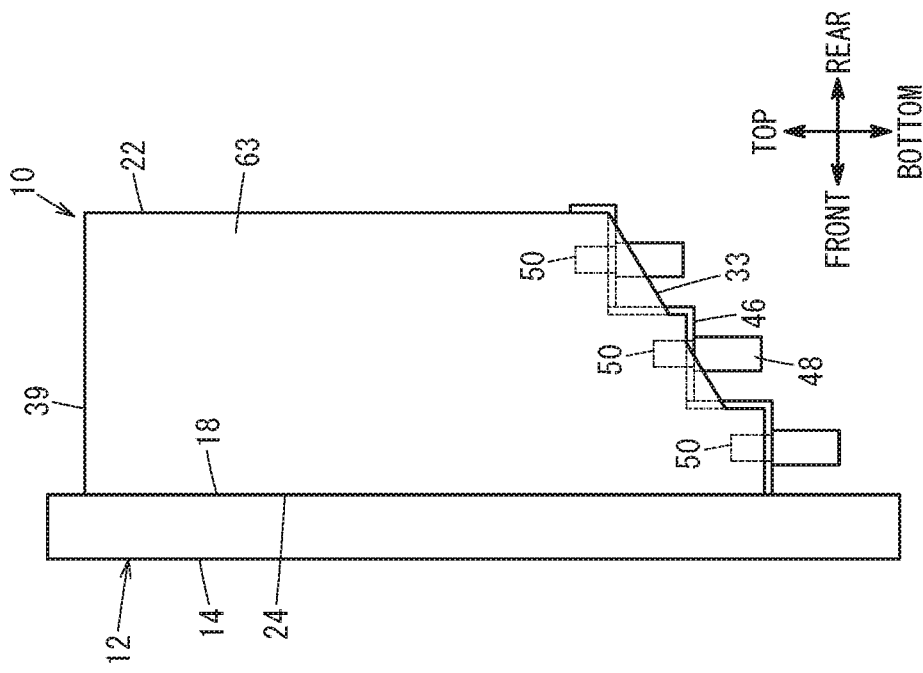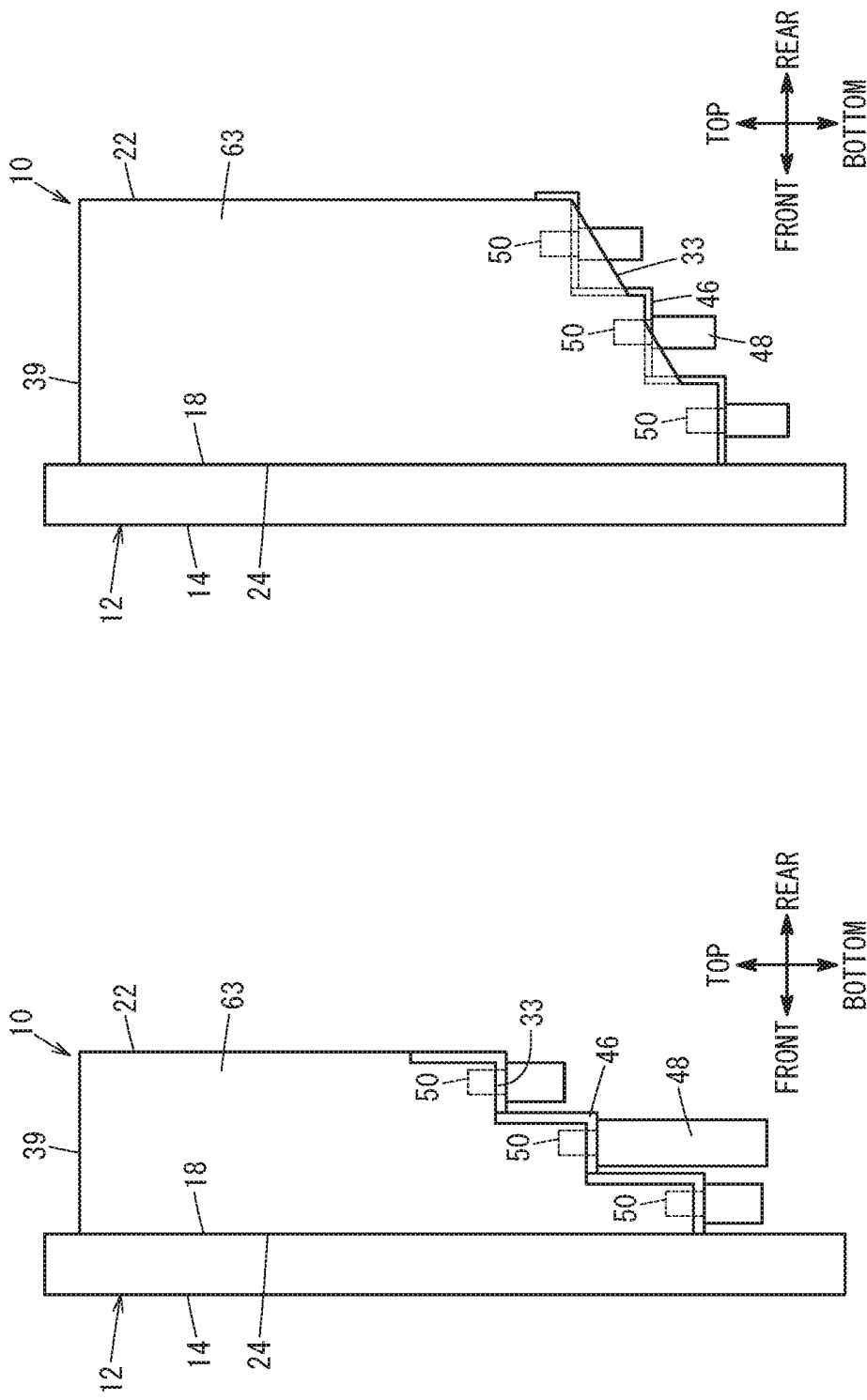

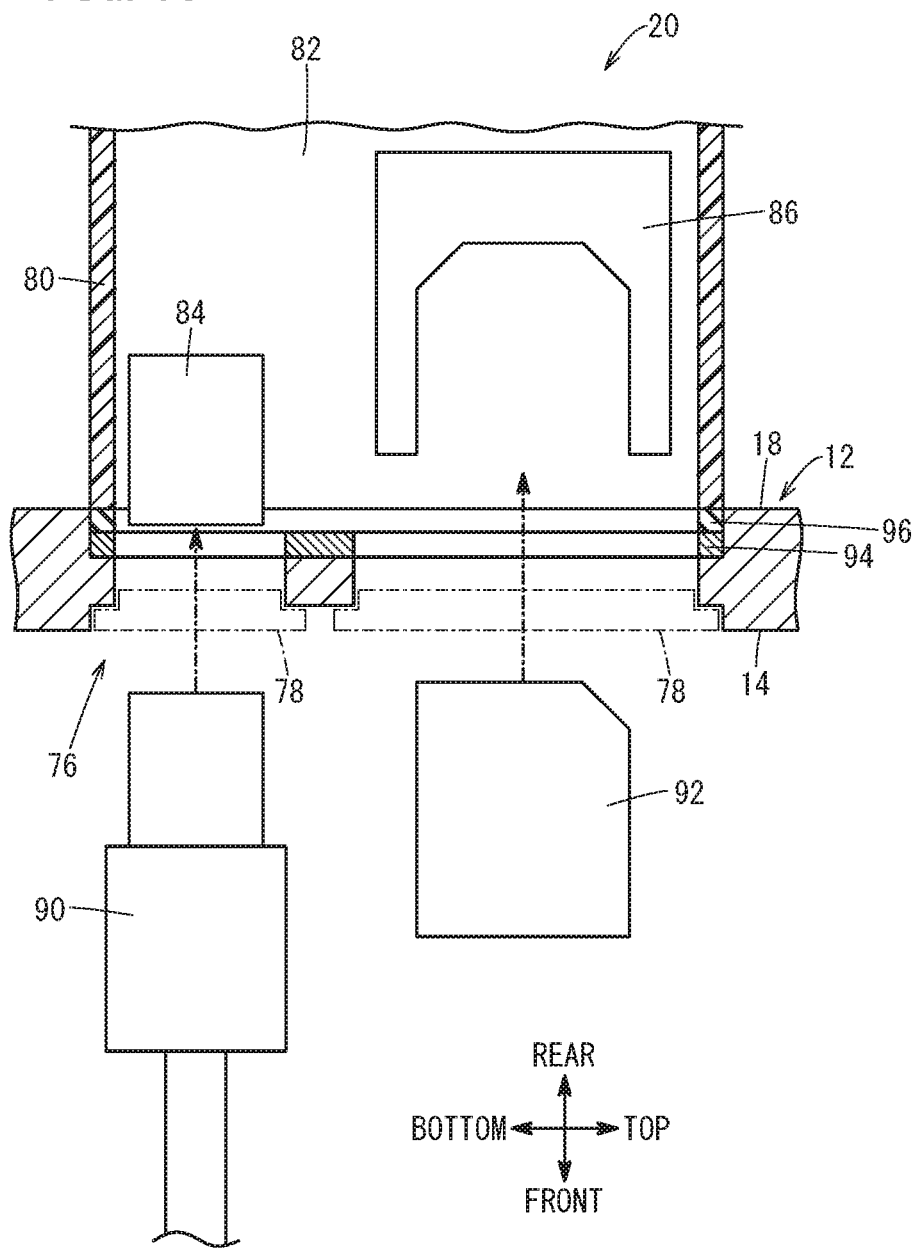

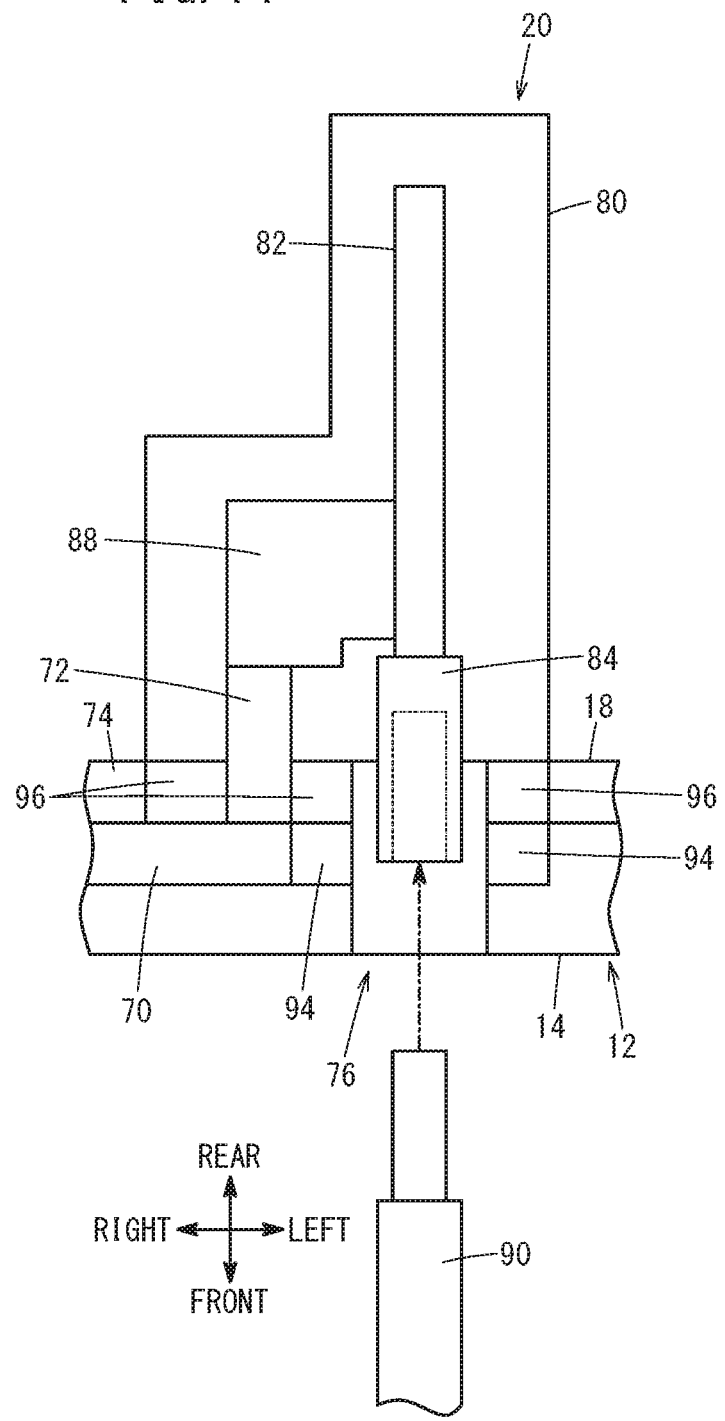

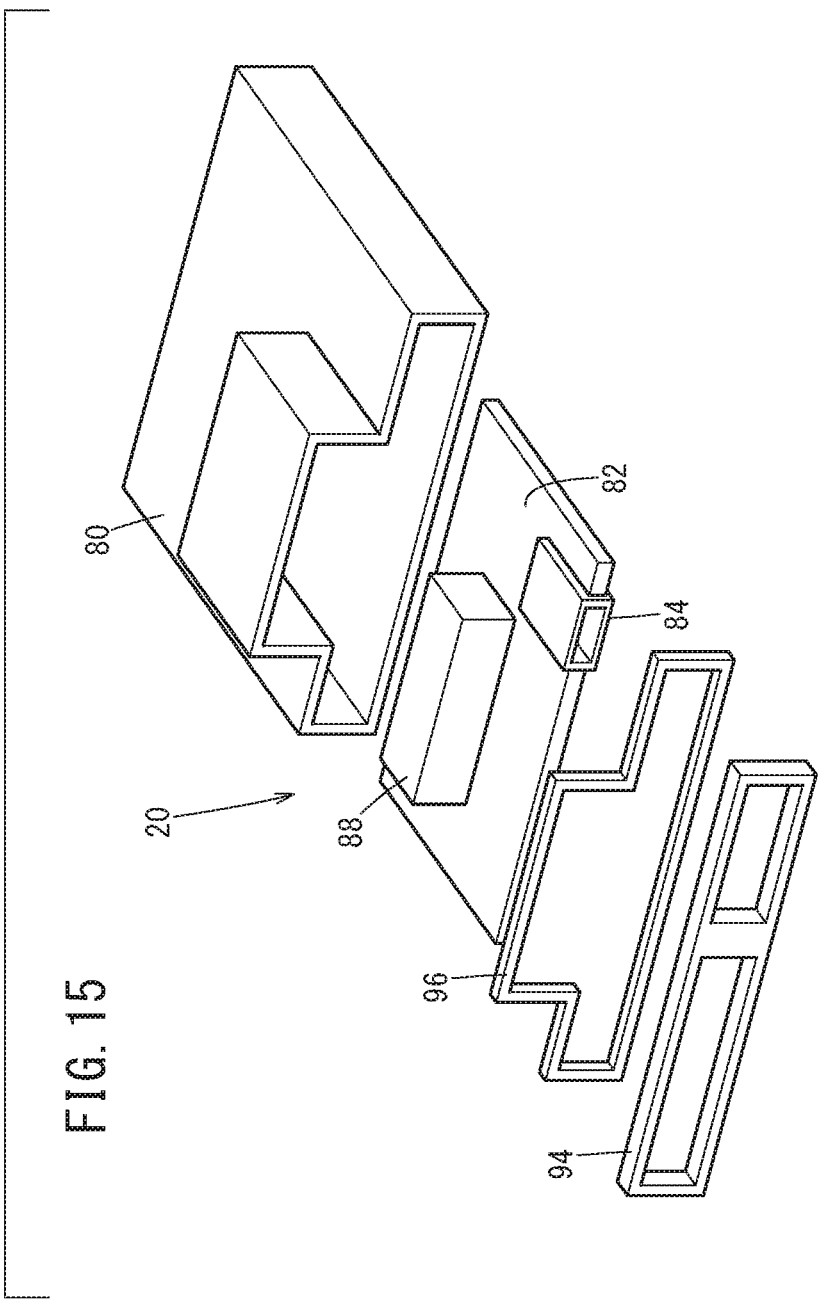

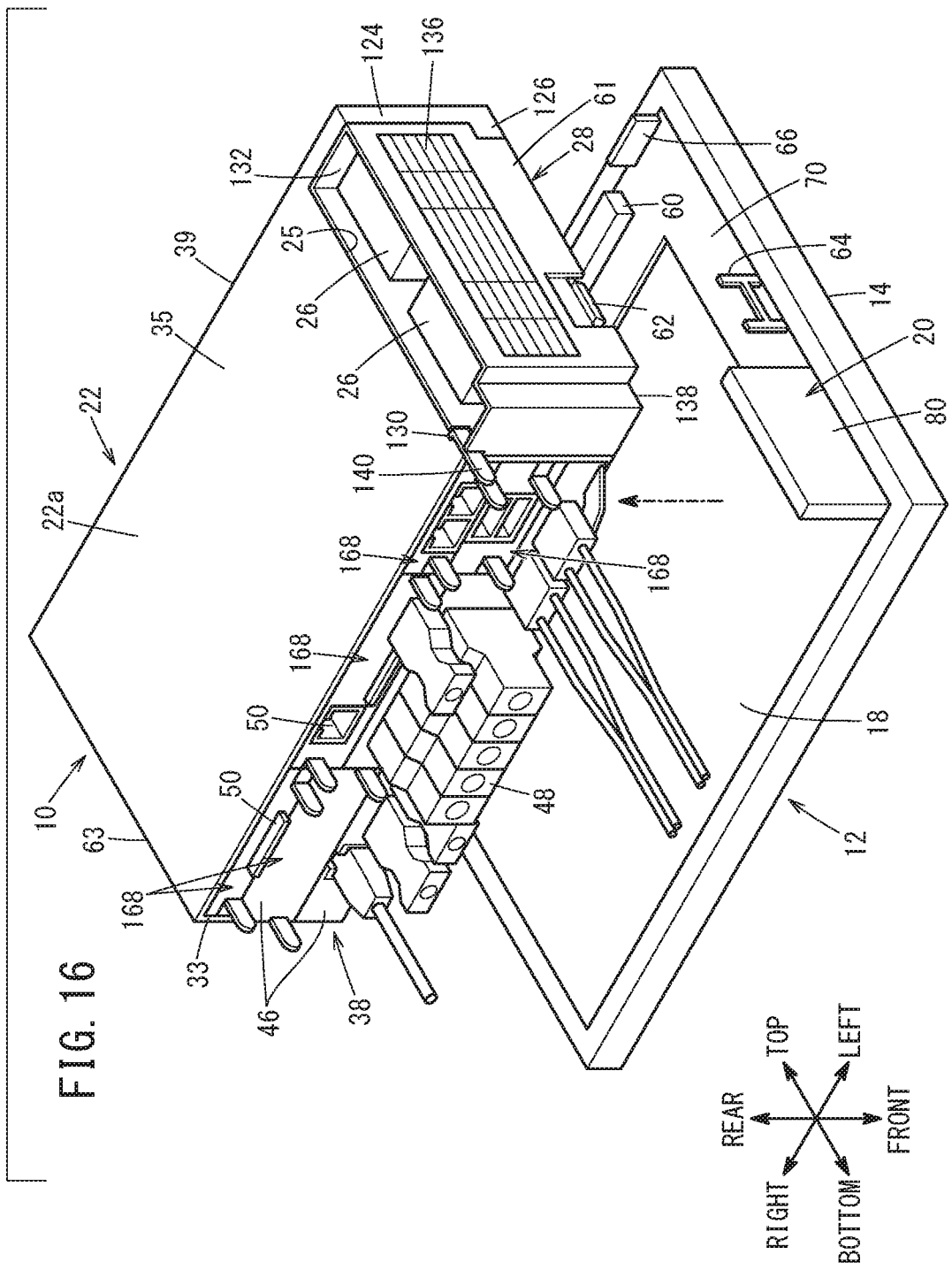

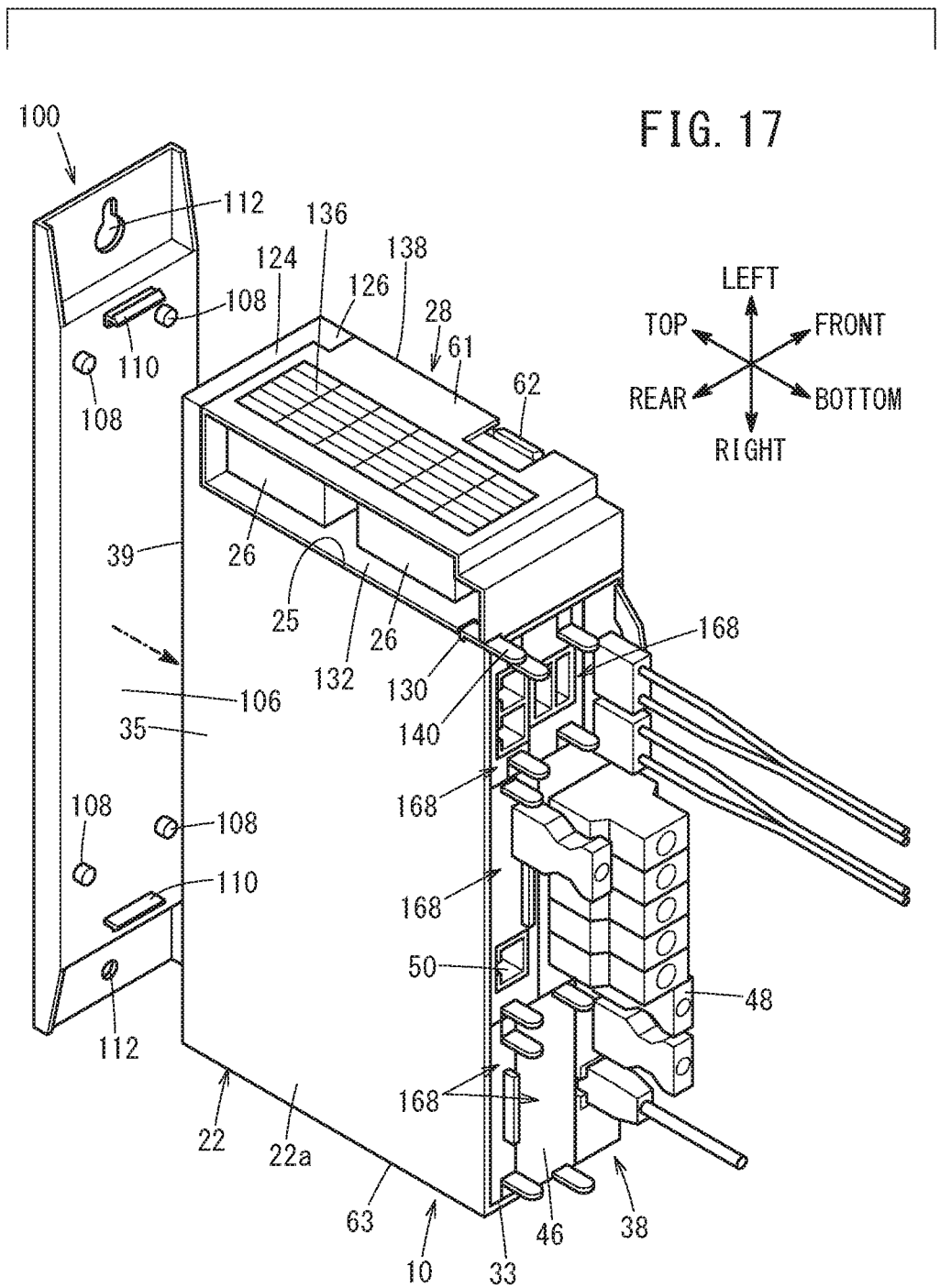

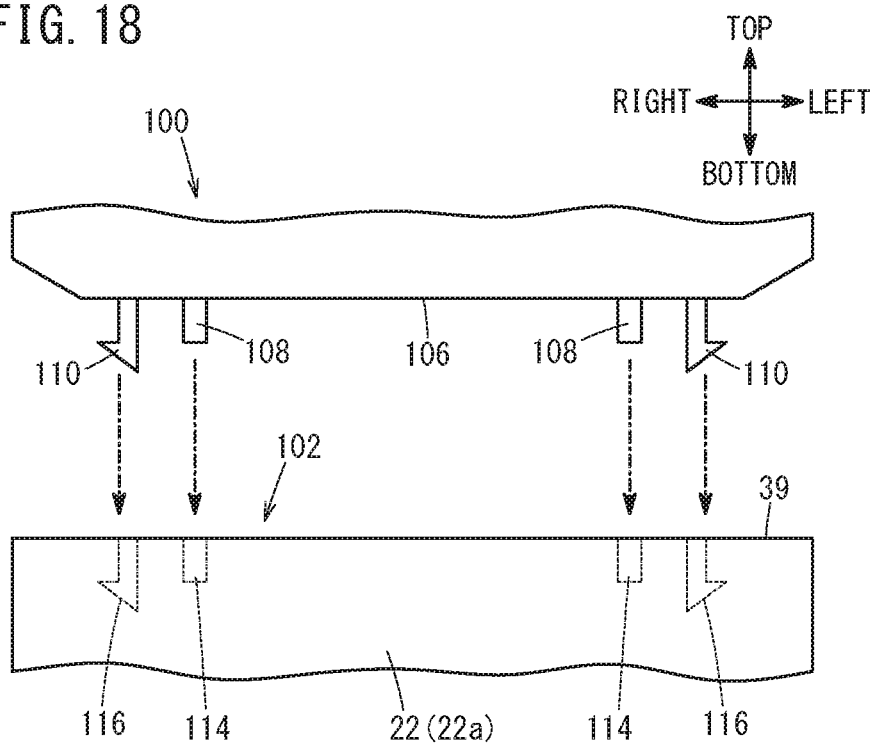

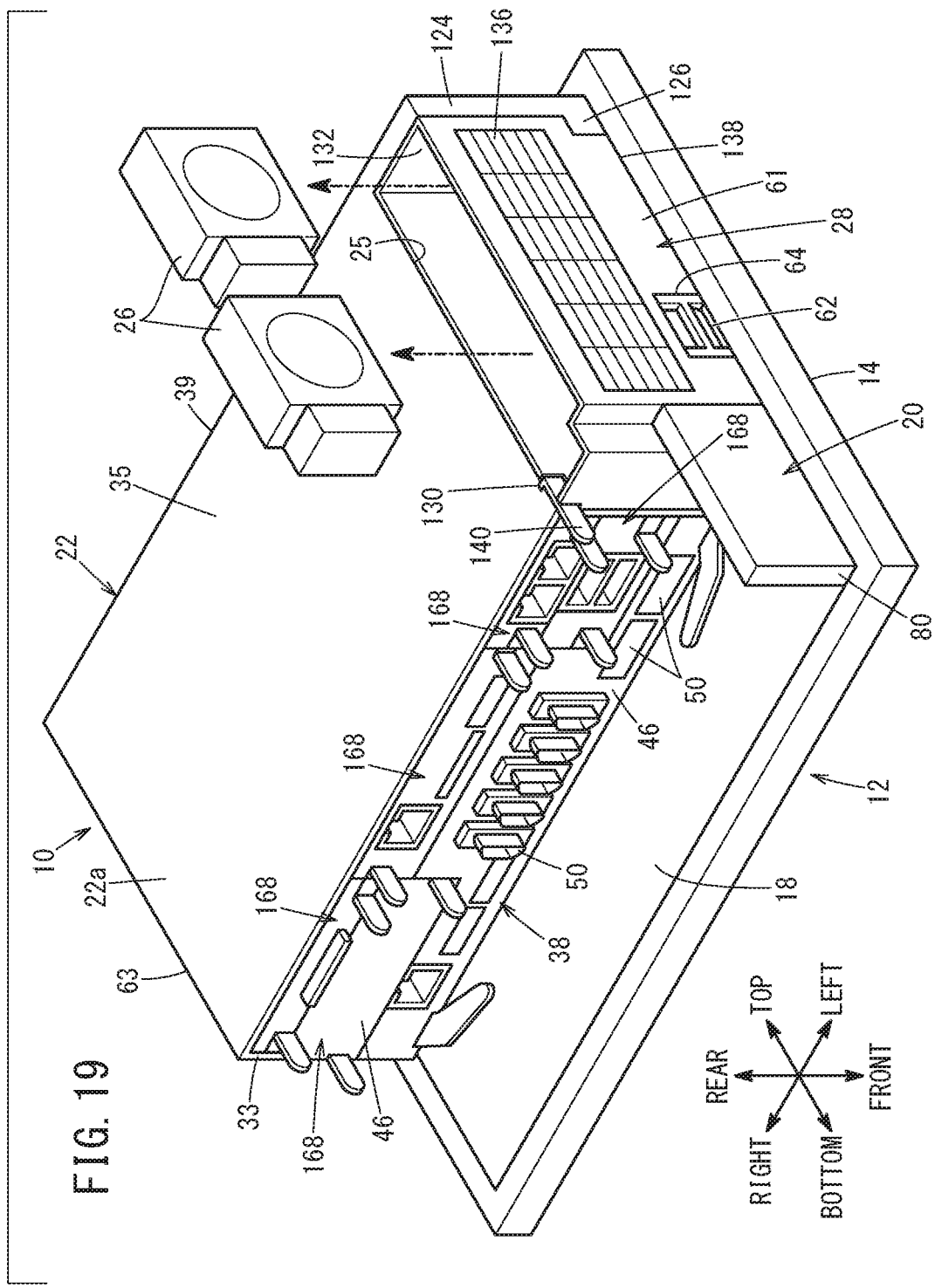

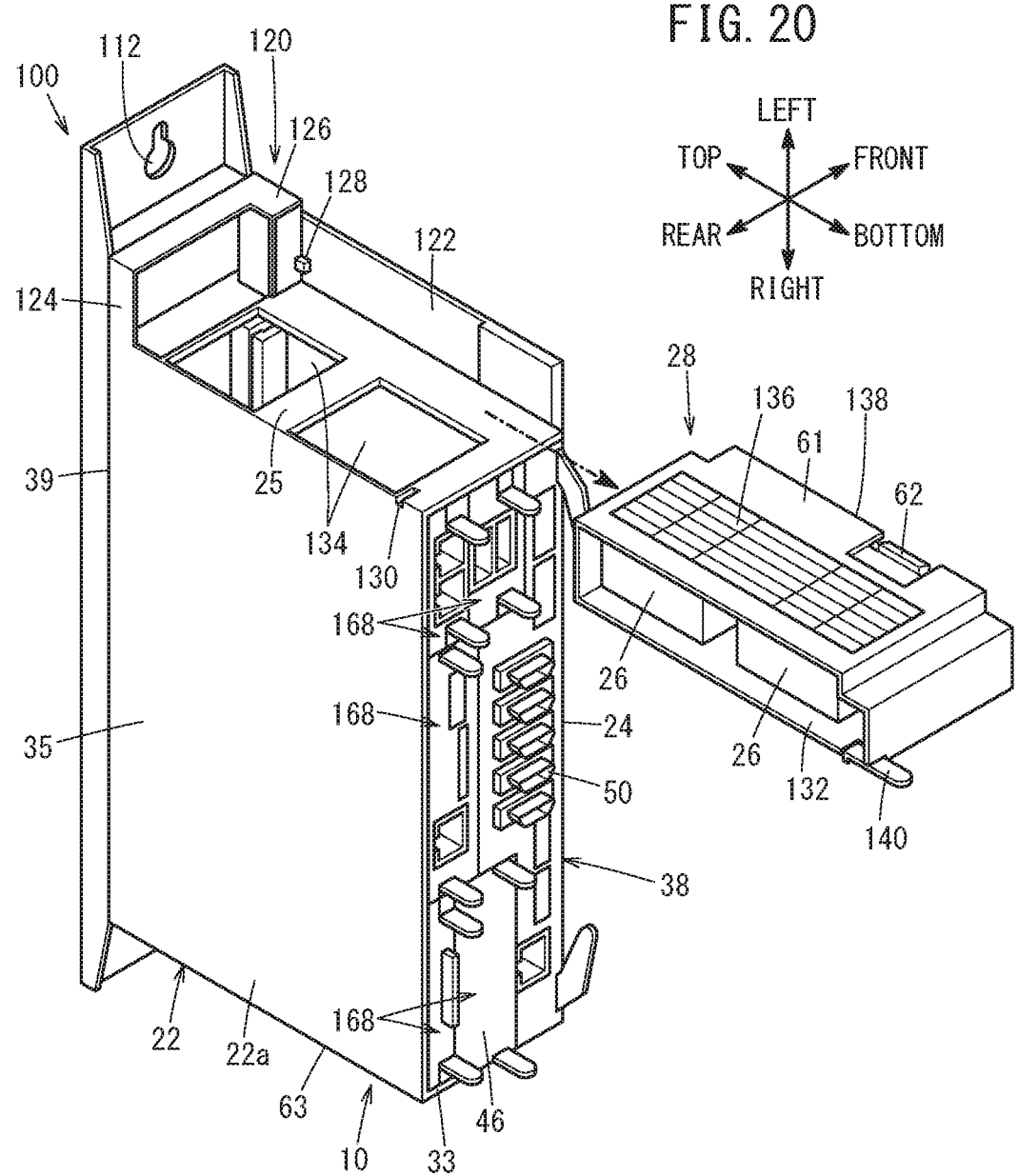

CONTROLLER

CROSS-REFERENCE TO RELATED APPLICATION

This application is based upon and claims the benefit of priority from Japanese Patent Application No. 2017-210466 filed on Oct. 31, 2017, the contents of which are incorporated herein by reference.

BACKGROUND OF THE INVENTION

Field of the Invention

The present invention relates to a controller attached to the back face of a display device for controlling the display device.

Description of the Related Art

Japanese Laid-Open Patent Publication No. 2015-192883 discloses a configuration in which a controller disposed on the back face of a display device includes a control board for controlling the display device and a board box for housing the control board.

SUMMARY OF THE INVENTION

In the invention described in Japanese Laid-Open Patent Publication No. 2015-192883, when the control board (control unit) is replaced, it is necessary to remove the board box from the back of the display device for replacing the control board. Therefore, in the invention described in Japanese Laid-Open Patent Publication No. 2015-192883, replacement work of the control board is troublesome, resulting in poor maintainability of the control board.

It is therefore an object of the present invention to provide a controller capable of improving maintainability of a control unit.

One of the aspects of the present invention resides in a controller which is attached to a back face of a display device, comprising: a housing; a control unit accommodated in a slot formed in the housing and configured to control the display device, the control unit being insertable into and removable from the slot; a backboard provided inside the housing on an interior side with respect to the direction of insertion of the control unit and connected to the control unit; a first connector provided for the display device; and a second connector connected to the first connector to establish connection between the backboard and the display device.

According to the present invention, since the control unit can be replaced simply by inserting and removing the control unit into and from the slot of the housing, it is possible to improve the maintenance performance of the control unit.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIGS. 8A and 8B are side views illustrating schematic configurations of controllers of comparative examples;

FIGS. 9A and 9B are side views illustrating schematic configurations of controllers according to variational examples of FIG. 1;

FIG. 13 is a schematic view, partially cutaway, showing a user interface unit in FIGS. 1 to 5;

FIG. 14 is a conceptual diagram illustrating the connection of a user interface unit of FIGS. 1 to 5 with a control board of a display device and a USB connector;

FIG. 15 is an exploded perspective view of a user interface unit in FIGS. 1 to 5;

FIG. 16 is a perspective view illustrating a state in which a controller is separated from a display device of FIG. 1;

FIG. 17 is a perspective view illustrating a state in which a support member is attached to a housing of the separated controller in FIG. 16;

FIG. 18 is a partial rear view illustrating a state in which the support member of FIG. 17 is attached to a support member attachment structure of the housing;

FIG. 19 is a perspective view illustrating a state in which fans are taken out from a fan unit of FIG. 1;

FIG. 20 is a perspective view illustrating a state in which a fan unit is detached from a separated controller;

DESCRIPTION OF THE PREFERRED EMBODIMENTS

A controller according to the present invention will be detailed hereinbelow by describing preferred embodiments with reference to the accompanying drawings.

[Schematic Configuration of Controller 10 and Display Device 12]

A schematic configuration of a controller 10 according to the present embodiment and a display device 12 will be described with reference to FIGS. 1 to 5.

Figure 2:
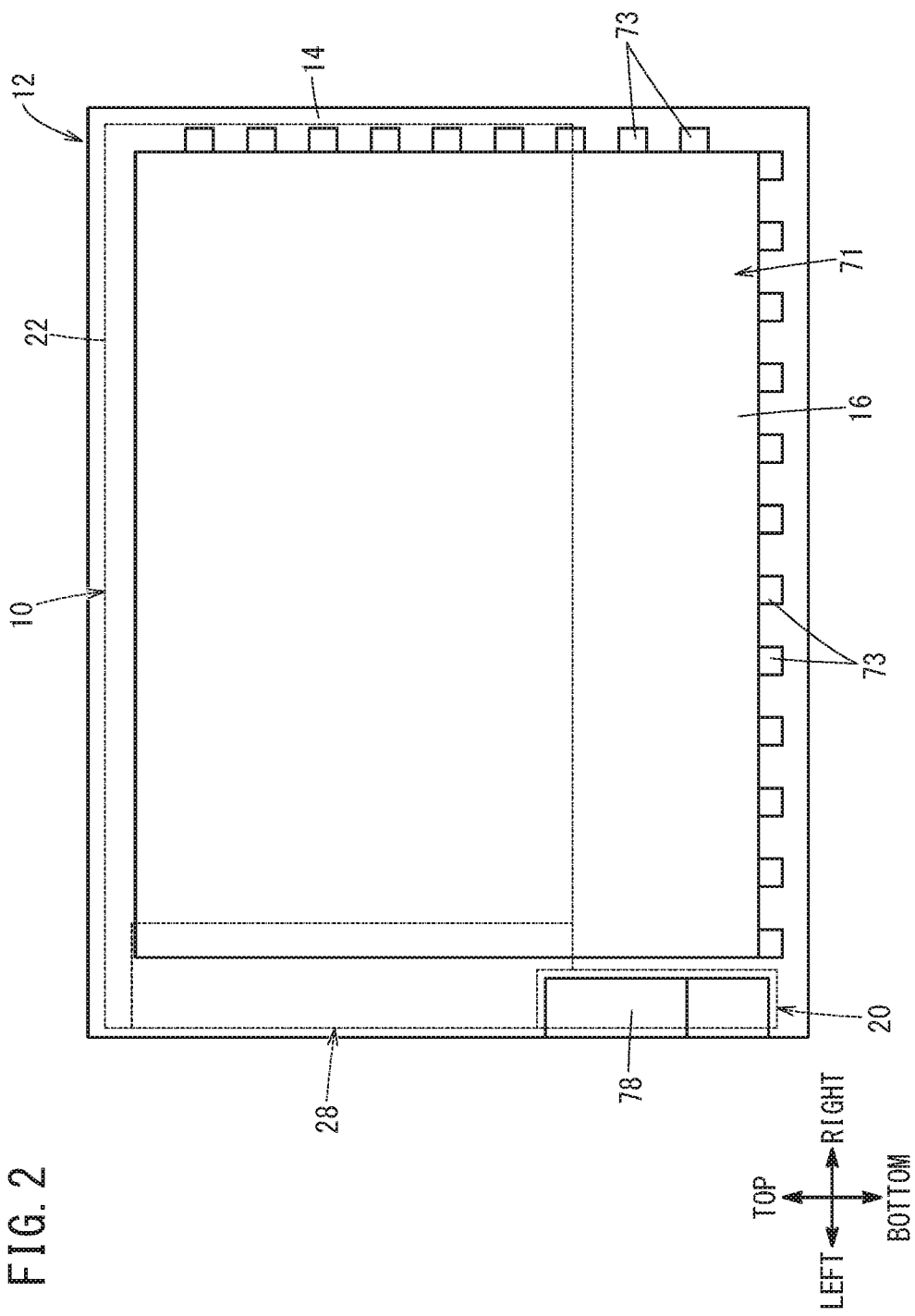
FIG. 2 is a front view of the display device of FIG. 1.

The controller 10 is a control device for controlling the display device 12. The display device 12 is a liquid crystal display unit having a display screen 16 (see FIG. 2) arranged on the front face, designated at 14. Note that the display device 12 may be another type of display unit. The controller 10 may be applied to, for example, a numerical control device for a CNC (computer numerical control) machine tool. In this case, the display device 12 is provided for the operation panel of the machine tool. In the following description, the directions of up and down, right and left, and front and rear are referred to in accordance with those viewed from the front of the display screen 16 of the display device 12, as shown in FIG. 2.

Figure 1:
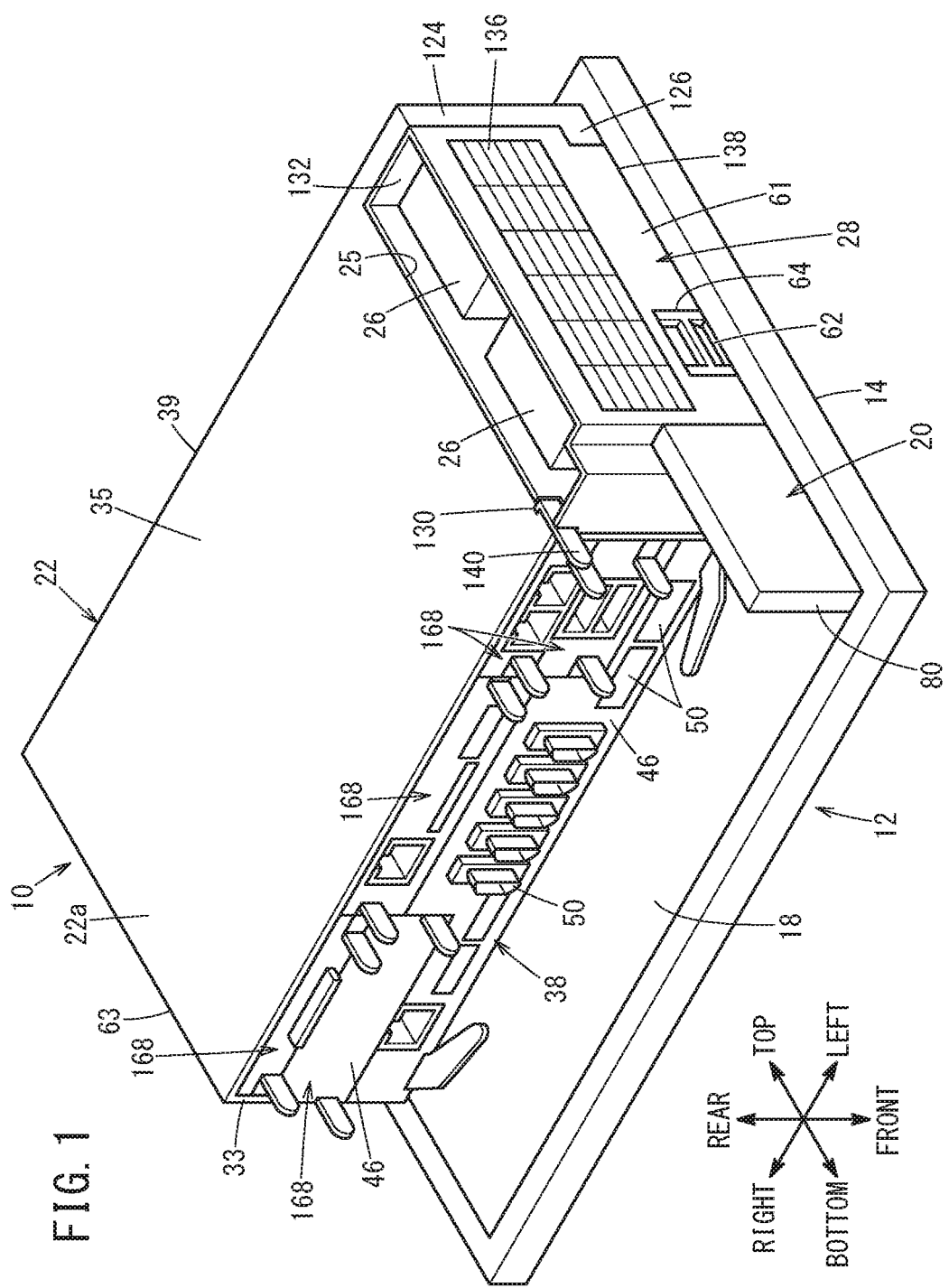
FIG. 1 is a perspective view illustrating a state in which a controller of an embodiment is attached to the back face of a display device.
Figure 3:
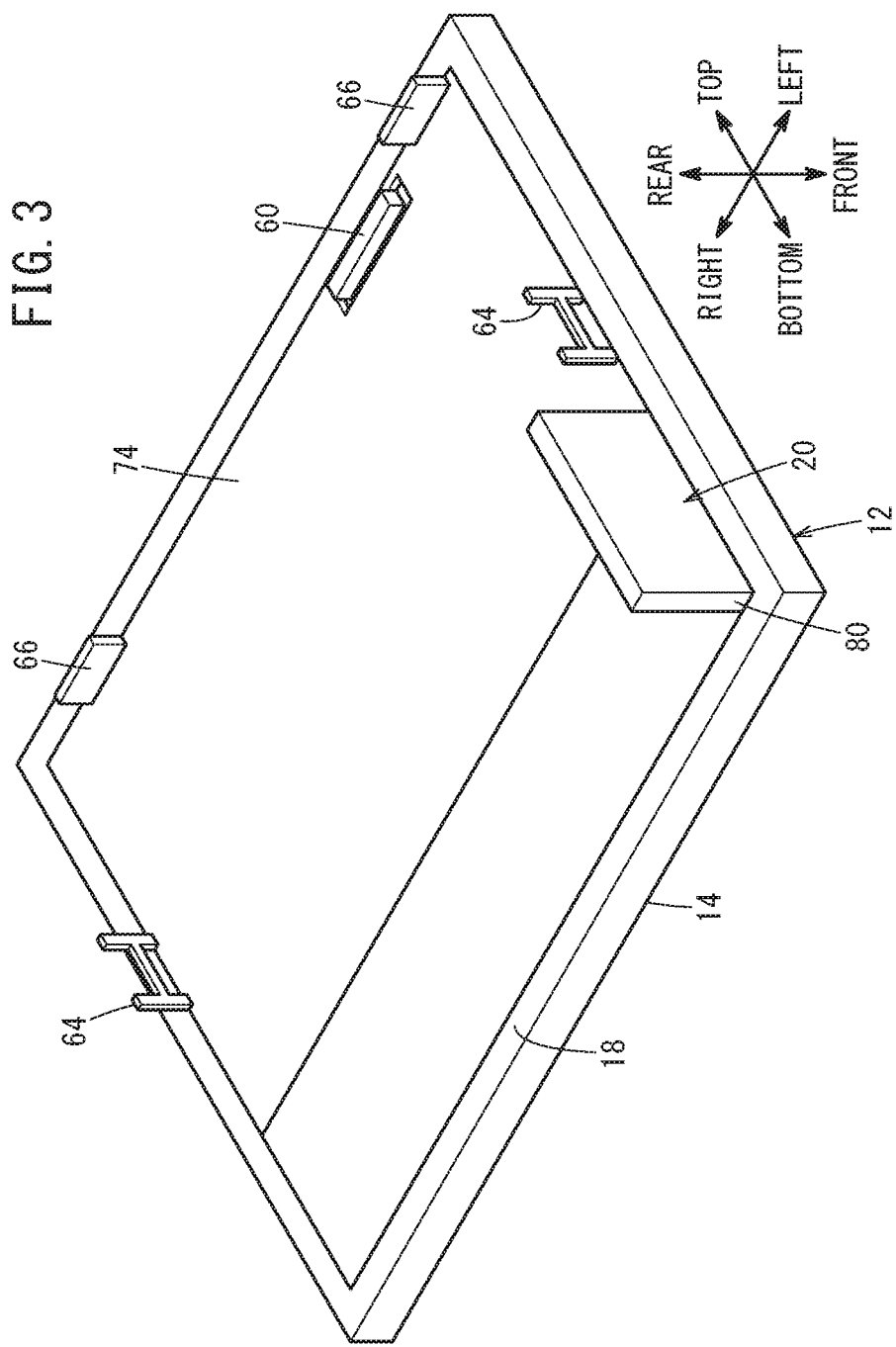
FIG. 3 is a perspective view of the display device of FIG. 1.
Figure 4:
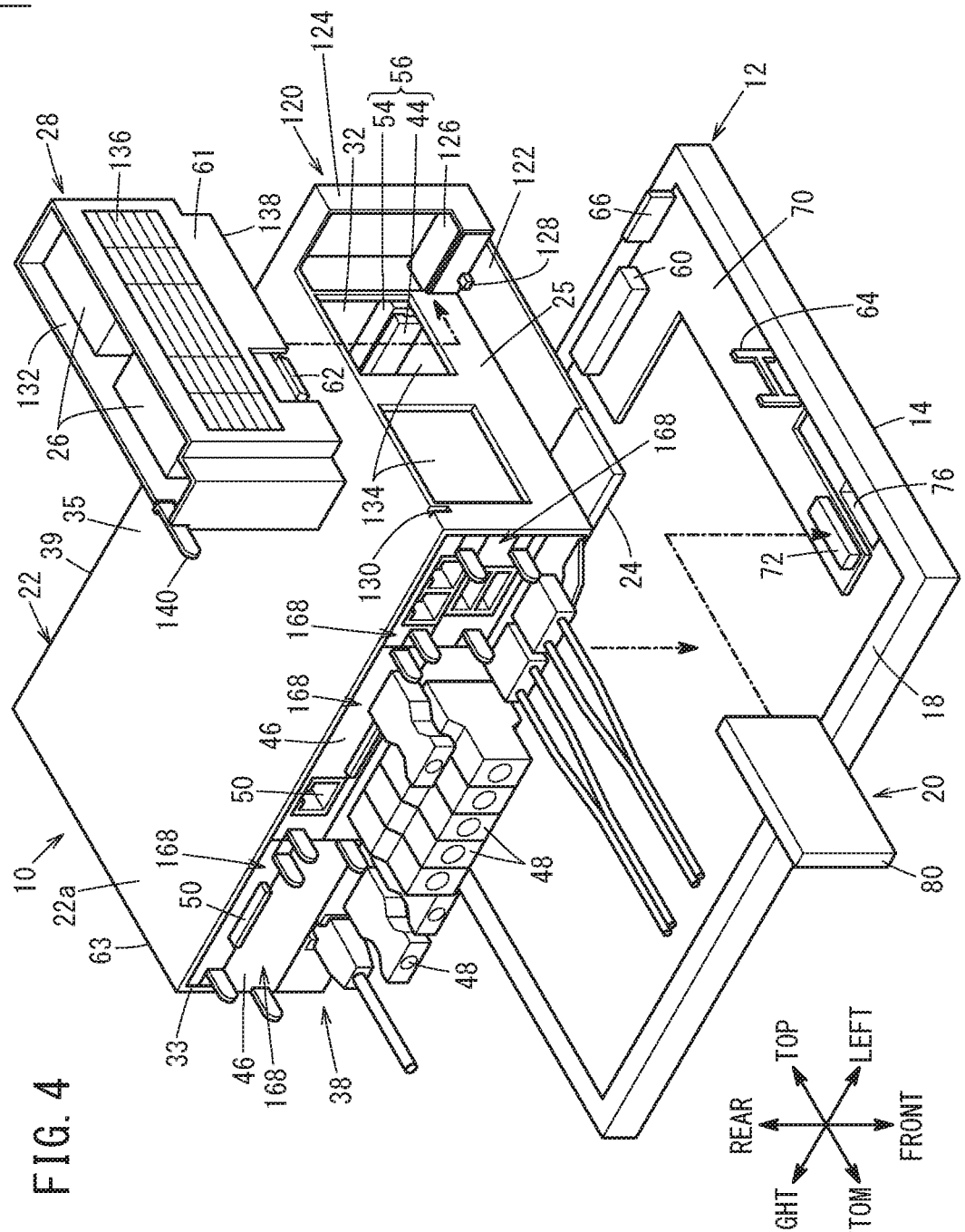
FIG. 4 is a perspective view showing a state in which a controller and a user interface unit are removed from the display device of FIG. 1.
Figure 5:
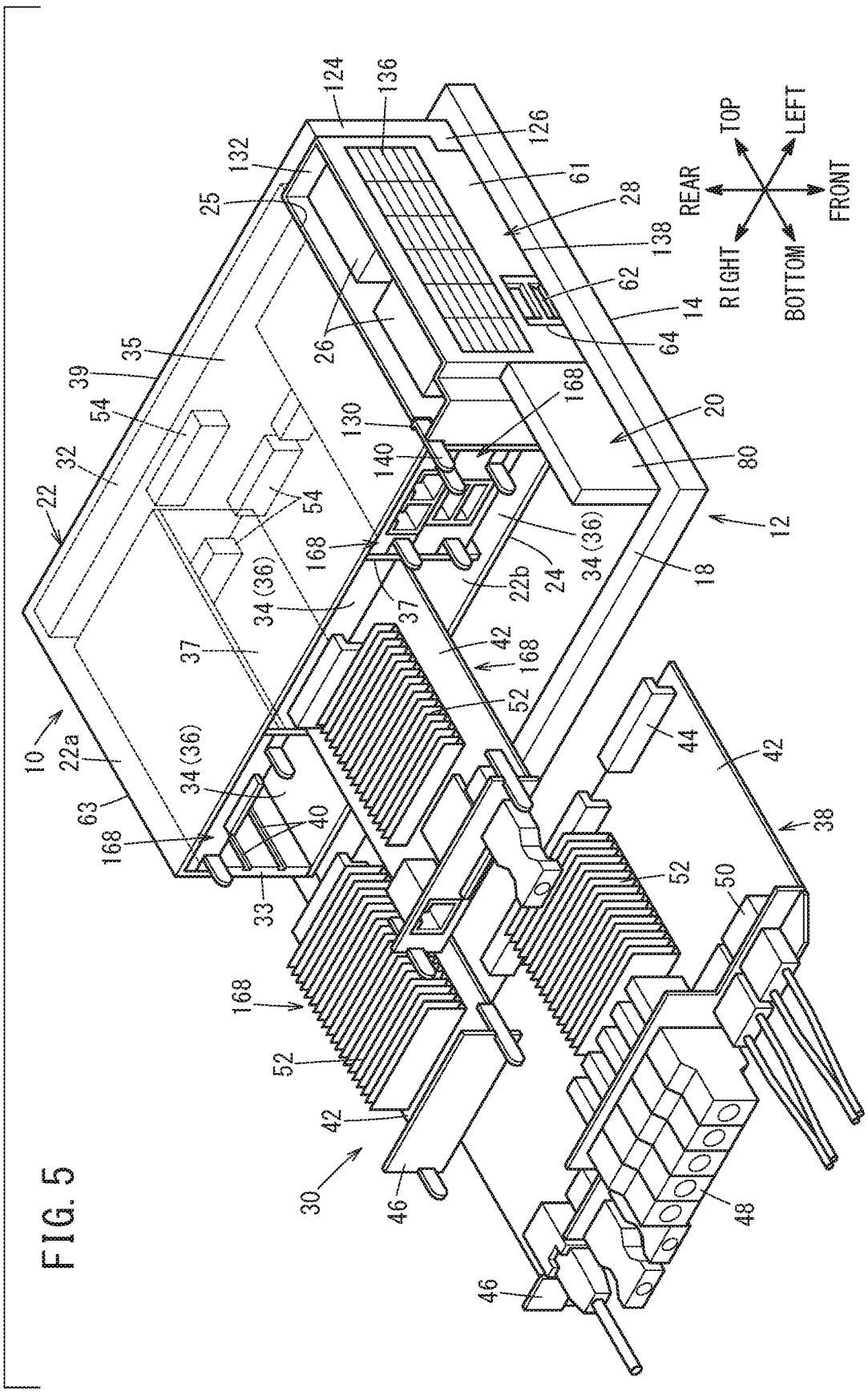
FIG. 5 is a perspective view illustrating insertion and removal of a main board and control boards with respect to slots of a housing in FIG. 1.

As shown in FIGS. 1, 4, and 5, the controller 10 and a user interface unit 20 are attached to a back face 18 opposite to the front face 14 of the display device 12, in a detachable manner. The user interface unit 20 is connectable to unillustrated external devices. In this case, the controller 10 is detachably attached to the upper side of the back face 18 of the display device 12. On the other hand, as shown in FIGS. 1 and 3 to 5, the user interface unit 20 is detachably attached to the lower corner portion on the back face 18 of the display device 12.

The controller 10 has a box-shaped housing 22 detachably attached to the back face 18 of the display device 12. The bottom face, designated at 24 (see FIGS. 4 to 6), of the housing 22 opposes the back face 18 of the display device 12. In this case, a fan unit 28 that accommodates two fans 26 to cool the interior of the housing 22 is detachably attached on one side face 25 of the housing 22 (the one extending in the vertical direction of the display device 12), which is located closest to the user interface unit 20 among the side faces adjacent to the bottom face 24 of the housing 22. It is sufficient that the fan unit 28 accommodates at least one fan 26 therein.

Next, the configurations of the controller 10, the display device 12, the user interface unit 20, and the fan unit 28, as well as the configuration for attaching and detaching them will be described below.

[Configuration of Controller 10]

The controller 10 will be described with reference to FIGS. 5 to 7. The controller 10 has the housing 22, a control unit 30 housed in the housing 22 to control the display device 12, and a backboard 32 housed in the housing 22 and connected to the control unit 30. The housing 22 is composed of a box-shaped casing body 22a having an opening on the front side of the housing 22 (on the back face 18 side of the display device 12) and a bottom plate 22b enclosing the opening portion of the casing body 22a. In this case, the side of the bottom plate 22b opposing the back face 18 forms a bottom face 24. In the housing 22 (the casing body 22a), among the side faces adjacent to the bottom face 24, the lower side face (lower face 33) adjacent to the side face 25 to which the fan unit 28 is attached is formed with a plurality of openings 34 of different shapes or sizes.

Formed inside the housing 22 are a plurality of slots 36 extending from the openings 34 in the vertical direction (direction of insertion) parallel to the side face 25 to which the fan unit 28 is attached. That is, a plurality of partition plates 37 (see FIGS. 5 and 7) extend from the casing body 22a's top plate, designated at 35, which is spaced from, and parallel to, the back face 18 of the display device 12, toward the bottom plate 22b. The plural partition plates 37 extend in the vertical direction and create a predetermined gap to the bottom plate 22b.

With this arrangement, the interior of the housing 22 is divided into plural spaces communicating with each other. FIGS. 5 and 7 illustrate a case where two partition plates 37 provided on the left and right divides the interior of the housing 22 into four chambers, i.e., three chambers along the left-right direction and one chamber on the bottom plate 22b's side. The plural divided chambers each form a slot 36, and each slot 36 has an opening 34 formed on the lower face 33 side. Therefore, all the slots 36 are provided in the lower face 33 of the housing 22. In this embodiment, a plurality of slots 36 may also be formed by adding a plurality of partition plates extending in the right-left direction to divide the interior space of the housing 22 with respect to the vertical direction.

The backboard 32 is a substrate connected to a main board 38 and a plurality of control boards 168 which will be described later. The backboard 32 is disposed in parallel with the upper side face (a top face 39) of the housing 22 and perpendicular to the bottom face 24, on the interior side of the housing 22 in the vertical direction, that is, on the far side in the vertical direction of the plural slots 36.

The control unit 30 includes the main board 38 and plural control boards 168 which are accommodated in the plural slots 36 to control the display device 12. The main board 38 and control boards 168 are insertable into and removable from the slot 36. Since the shapes or sizes of the slots 36 (openings 34) are different from each other, the main board 38 and plural control boards 168 are each shaped or sized to match the associated opening 34 so as to be inserted into the corresponding slot 36. As shown in FIGS. 1, 4, and 5, in the controller 10, the main board 38 has a substrate 42 of the largest size and is accommodated in the slot 36 on the bottom face 24 side. In addition, the plural control boards 168 each have a substrate 42 smaller in size than the main board 38.

Provided in the housing 22 are guides 40 on both left and right sides of each slot 36. The guides 40 are each a guide rail provided in the vertical direction on the surfaces of the partition plates 37 and the side portions forming the side faces 25, 63 of the casing body 22a of the housing 22. The guides 40 guide the main board 38 and plural control boards 168 which are inserted into the slots 36, to the backboard 32 along the vertical direction. Use of the guides 40 makes it unnecessary to position the main board 38 and the plural control boards 168 with respect to the front-rear direction and the right-left direction when they are inserted into the slots 36.

Each of the main board 38 and the plural control boards 168 includes a substrate 42 extending in the vertical direction and guided by the left and right guides 40 of the slots 36, a connector (third connector) 44 provided on the backboard 32 side of the substrate 42, and a cover 46 arranged on the opposite side of the connector 44 on the substrate 42. When the main board 38 or control board 168 is inserted into the slot 36, the cover 46 abuts the lower face 33 of the housing 22 to close the opening 34. Thus, formation of the main board 38 and plural control boards 168 into units in this way facilitates the main board 38 and the plural control boards 168 to be packaged and transported and also makes it easy to take electrostatic countermeasures for the main board 38 and plural control boards 168.

Figure 7:
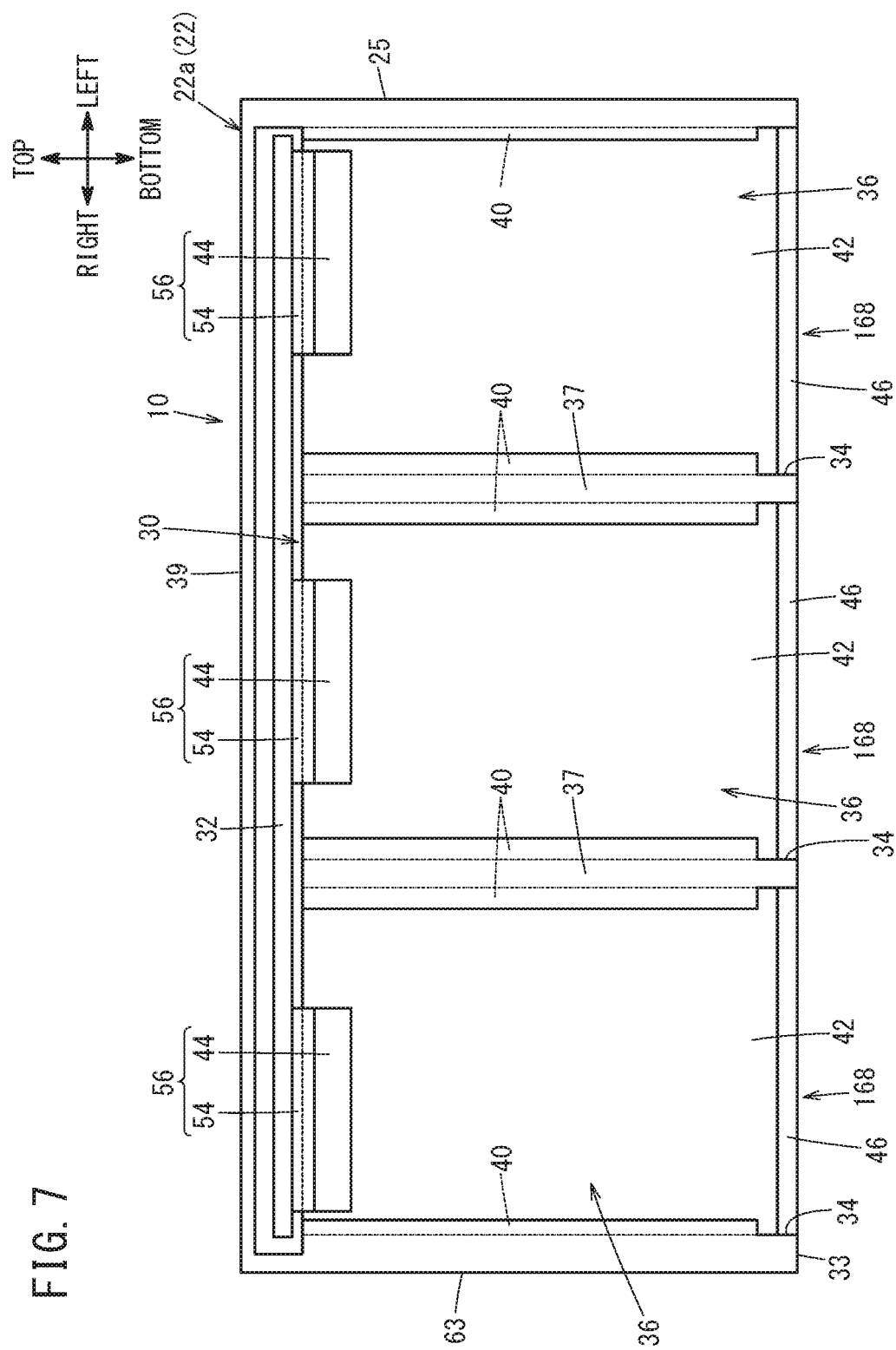
FIG. 7 is a conceptual diagram illustrating the connection of a control board with a backboard in a rear view.

As conceptually illustrated in FIG. 7, as to each of the plural control boards 168, the connector 44 on the substrate 42 is arranged so that the attachment position of the connector 44 relative to the control board 168 differs from the attachment positions of the other connectors when the multiple control boards 168 are viewed from the vertical direction (the direction of insertion). Here, shifting the positions of attachment of connectors 44 with respect to either the right-left direction or the front-rear direction can suffice the purpose.

In order to improve guiding for connection, absorbing of positional deviation, and insertion performance at the time of connecting the connector 44 to an after-mentioned connector (fourth connector) 54 provided on the backboard 32, connectors 44 for the main board 38 and plural control boards 168 preferably use a floating type. Here, as shown in FIGS. 1, 4, and 5, the main board 38 and plural control boards 168 may further include at least one of a connector 50 exposed to the outside through the cover 46 and connected to an external connector 48 and an electronic component 52, such as a radiator, mounted on the substrate 42.

A plurality of connectors 54 are attached on the surface of the backboard 32 facing the main board 38 and the plural control boards 168. The plural connectors 54 are connected to the connectors 44 of the main board 38 and plural control boards 168 which are inserted into the plural slots 36.

Figure 6:
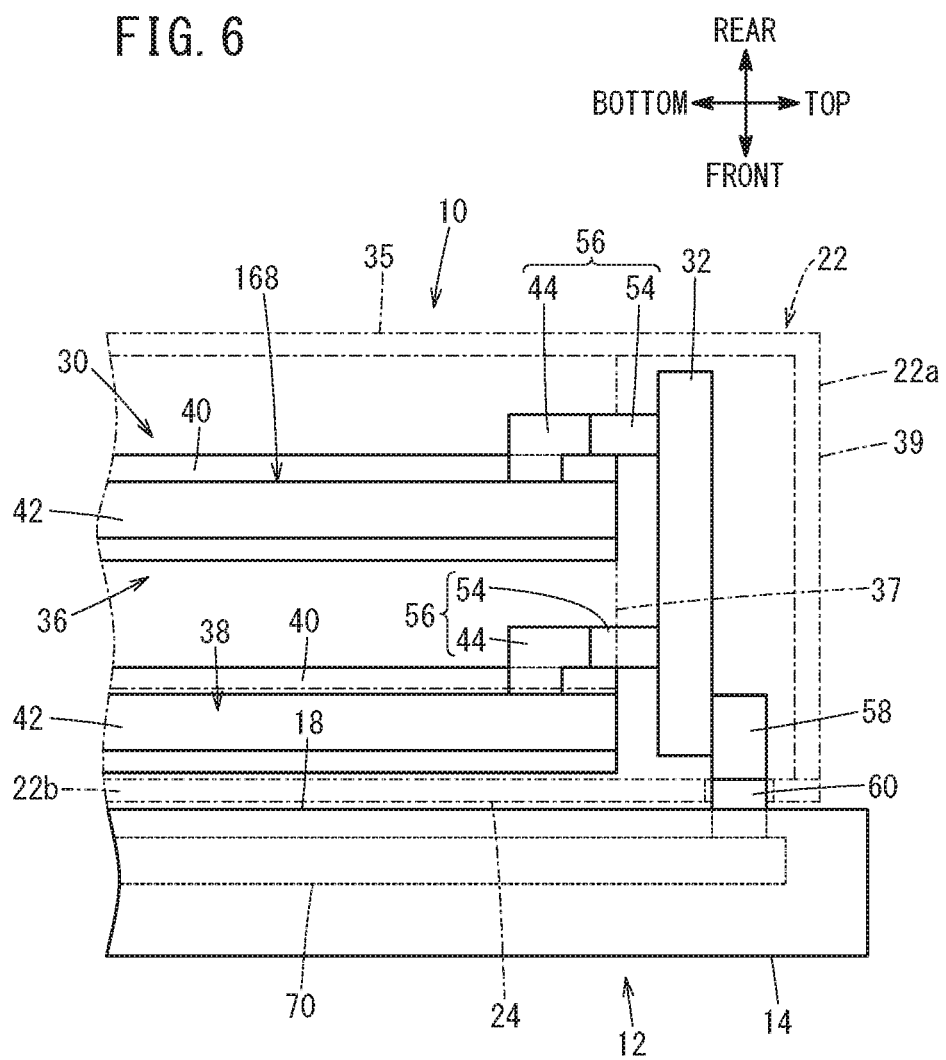
FIG. 6 is a conceptual diagram illustrating the connection of a main board and a control board with a backboard, and the connection between the backboard and a display device in a side view.

As shown in FIGS. 5 to 7, when the substrate 42 is inserted into the slot 36 for each of the main board 38 and plural control boards 168, the inserted substrate 42 can be moved to the backboard 32 along the guides 40 on the left and right sides. As a result, the connectors 44 of the main board 38 and plural control boards 168 are fitted to the connectors 54 on the backboard 32 so that the main board 38 and plural control boards 168 are electrically connected to the backboard 32. The fitted connectors 44, 54 form junctions 56 for electrically connecting the main board 38 and the plural control boards 168 to the backboard 32. Further, as the main board 38 and the plural control boards 168 move to the backboard 32, covers 46 abut the lower face 33 of the housing 22 and close the openings 34 of the associated slots 36.

On the other hand, when the cover 46 of each of the main board 38 and plural control boards 168 which have been inserted in the slots 36 and electrically connected to the backboard 32, is pulled downward, the connector 44 and the connector 54 are separated from each other, so that the main board 38 and plural control boards 168 can be pulled out along the left and right guides 40 from the slot 36.

In this manner, it is possible to electrically connect the main board 38 and the plural control boards 168 with the backboard 32 and take them out by inserting the main board 38 and the plural control boards 168 into the slots 36 and removing (drawing) them therefrom. Thus, it is possible to improve maintenance performance of the control unit 30 (the main board 38 and the control boards 168). That is, the main board 38 and the plural control boards 168 can be easily exchanged by one insertion/removal operation of each board for the slot 36.

All the slots 36 are formed in the lower face 33 of the housing 22 so as to extend in the vertical direction parallel to the back face 18 of the display device 12. Thereby, the main board 38 and the plural control boards 168 can be easily inserted/removed without interfering with the display device 12.

Furthermore, the plural slots 36 (openings 34) have different shapes or sizes, and the main board 38 and the plural control boards 168 each have a shape or size corresponding to the shape or size of the associated opening 34. Accordingly, when inserting the main board 38 and the plural control boards 168 into the slots 36, erroneous insertion of the main board 38 and the plural control boards 168 can be prevented. In addition, the covers 46 provided on the main board 38 and the plural control boards 168 each have a shape or size corresponding to the opening 34 of the slot 36 into which they are inserted. Accordingly, it is possible to reliably prevent the main board 38 and the plural control boards 168 from being erroneously inserted into a slot 36 other than the correct one.

Furthermore, the attachment positions of the connectors 44 on the control boards 168 are shifted from each other.

Thereby, it is possible to prevent erroneous connection between the connectors 44, 54 when the control board 168 is inserted into the slot 36. That is, it is possible to prevent the connector 44 of a control board 168 from being wrongly connected to a connector 54 other than correct one.

As shown in FIG. 6, a connector (second connector) 58 is provided for the backboard 32. The connector 58 is provided on the face (the top face 39 side) of the backboard 32 opposite to the face on which the plural connectors 54 are formed, and close to the bottom face 24. The connector 58 is electrically connected to the plural connectors 54. This connector 58 is arranged so as to be exposed from the bottom face 24 to the outside. A connector (first connector) 60 is provided in the upper part of the back face 18 of the display device 12 so as to oppose the connector 58.

Further, as shown in FIGS. 1, 4, and 5, an engagement claw 62 is formed in the fan unit 28 attached to the housing 22, on a side face 61, opposite from the side face 25 of the housing 22, extending in the vertical direction, and exposed to the outside. Another engagement claw (not shown) similar to the engagement claw 62 is provided on the side face 63 of the housing 22, opposite from the side face 25. As the counterpart, a pair of engagement parts 64 are provided on the left and right sides of the back face 18 of the display device 12, as shown in FIGS. 1, 3, 4 and 5, so as to be engaged with the engagement claw 62 and the unillustrated engagement claw. A pair of plate-like positioning pieces 66 (see FIGS. 3 and 4) are provided at higher positions than the connector 60 at the left and right sides of the back face 18 of the display device 12. As to the attachment structure of the fan unit 28 to the housing 22, description will be given later.

In this arrangement, in the state that the fan unit 28 is attached to the housing 22 and that the bottom face 24 of the housing 22 is positioned to oppose the back face 18 of the display device 12, the housing 22 is moved to approach the back face 18. Then, the top face 39 of the housing 22 comes into contact with the two positioning pieces 66 and is positioned. In this state, as the housing 22 is brought closer to the back face 18 of the display device 12, the two engagement claws (62 and the unillustrated one) engage with the left and right engagement parts 64, respectively. Thus, the housing 22 is attached to the back face 18 of the display device 12. As a result, as shown in FIG. 6, the connector 58 on the backboard 32 side and the connector 60 of the display device 12 are joined or fitted in the front-rear direction so that the backboard 32 and the display device 12 are electrically connected.

Accordingly, the controller 10 is attached to the back face 18 of the display device 12 by the engagement between the left engagement claw 62 and the engagement part 64, the engagement between the right engagement claw and the engagement part 64, and the fitting between the connector 58 and the connector 60 (i.e., connected at three portions). As a result, the main board 38 and plural control boards 168 become able to control the display device 12 via the junction 56, the backboard 32 and the two connectors 58, 60 and receive signals output from the display device 12.

Moreover, in the backboard 32, in order to electrically connect the main board 38 and the plural control boards 168 to the display device 12, electrical connections from the main board 38 and the plural control boards 168 are integrated into the single connector 58. Thus, it is possible to further facilitate connection and disconnection between the controller 10 and the display device 12.

In the state where the controller 10 has been attached to the back face 18 of the display device 12, as the engagement of the engagement claws (62 and the unillustrated one) with the engagement parts 64 is released, then the housing 22 is moved away to the rear from the back face 18 of the display device 12, the fitting state between the connector 58 and the connector 60 is released so that the controller 10 can be removed from the back face 18 of the display device 12.

The above description has been given by providing a case where the controller 10 is attached to the back face 18 of the display device 12 with the bottom face 24 of the housing 22 opposed against the back face 18 of the display device 12. However, in the present embodiment, it is also possible to configure the controller 10 so that the controller 10 is attached to the back face 18 of the display device 12 with another face (for example, the top face 39) of the housing 22 opposed against the back face 18 of the display device 12. Further, in the above description, the slots 36 are formed on the lower face 33 of the housing 22, but the controller 10 may be configured so that slots 36 are arranged on the other face (for example, the side face 63) of the housing 22.

[Variational Examples of Controller 10]

Next, variational examples of the controller 10 will be described with reference to FIGS. 8A to 12B. A variational example herein is aimed at facilitating connectors 48 to be connected to the connectors 50 on the main board 38 and the plural control boards 168 (see FIGS. 1, 4 to 7), by manipulating the shape of the lower face 33 on which the opening 34 (see FIGS. 5 and 7) of the housing 22 is formed and the shape of the cover 46. In this variational example, the same components as those of the controller 10 and the display device 12 described with reference to FIGS. 1 to 7 are allotted with the same reference numerals, and the detailed description thereof is omitted. The same applies to those that follow. Also in the comparative examples of FIGS. 8A and 8B, the same components as those of the controller 10 and the display device 12 of FIGS. 1 to 7 are allotted with the same reference numerals for description.

In FIG. 8A, the lower face 33 of the housing 22 is formed of a substantially flat plane. Therefore, in a state where the main board 38 and the plural control boards 168 have been inserted in the slots 36 (see FIGS. 5 and 7) with the openings 34 closed with the covers 46, the operator needs to look at the cover 46 of the housing 22 from below and confirm the positions of connectors 50 when plugging an external connector 48 into one of the connectors 50 on the main board 38 and plural control boards 168. That is, the task of inserting/removing the connectors 48 into/from the connectors 50 is difficult to achieve because of bad visibility.

Further, as shown in FIG. 8B, when a large connector 48 is connected to the connector 50, the connector 48 after plugging in protrudes downward below the display device 12 as indicated by the broken line. Therefore, there is a risk that the large connector 48 interferes with the lower area of the display device 12.

To deal with this, in this variational example, as shown in FIG. 9A, the lower face 33 of the housing 22 is configured to be stepwise so that the heights of slot openings are raised from the back face 18 of the display device 12 toward the rear while the openings 34 are lidded by covers 46 having L-shaped cross-sections. In this case, it is preferable that the rise, or the vertical stepping area of each cover 46 of L-shape is written with information about the connector 48 to be connected to the connector 50 or information about the connector 50 to be connected to the connector 48. This enables the operator to easily identify the position of a connector 50 into which a connector 48 is inserted. Thus, the visibility at the time of connecting the connectors 48, 50 is improved so that connectors 48 can be easily inserted (plugged) into and removed (unplugged) from connectors 50.

In this configuration, it is preferable that the board, either the main board 38 or the control board 168, having a connector 50 to which a large connector 48 is plugged, is allotted to a slot 36 that is located distant from the back face 18 of the display device 12. Thereby, this makes it possible to avoid protrusion of the plugged connector 48 below the display device 12 when the large connector 48 is connected to the connector 50. Thus, interference of the large connector 48 with the lower area of the display device 12 can be avoided, so that it is possible to mount a large connector 48 on the controller 10.

Further, as a further variational example from this, as shown in FIG. 9B, the lower face 33 of the housing 22 may be obliquely inclined from the back face 18 of the display device 12 toward the rear. In this case, the portion forming the opening 34 is depressed upward and/or projected downward. As a result, a plurality of flat faces parallel to the front-rear direction are formed, so that openings 34 can be formed in each of the plural flat faces. Therefore, by lidding each opening 34 with a cover 46 having an L-shaped cross-section, the same effect as that of the configuration of FIG. 9A can be obtained.

FIGS. 10A to 12B are rear and bottom views of the display device 12 and controller 10 having variational arrangements of covers 46 in a housing 22.

Figure 10A:
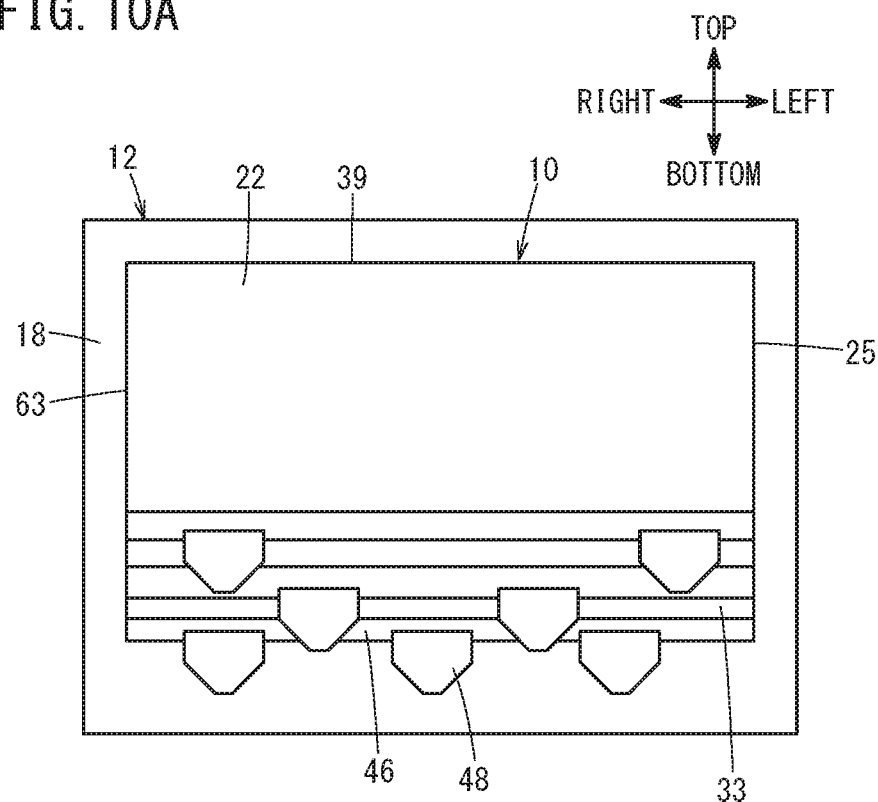
FIGS. 10A and 10B are a rear view and a bottom view, respectively, illustrating a schematic configuration of a controller of a variational example of FIG. 1.
Figure 10B:
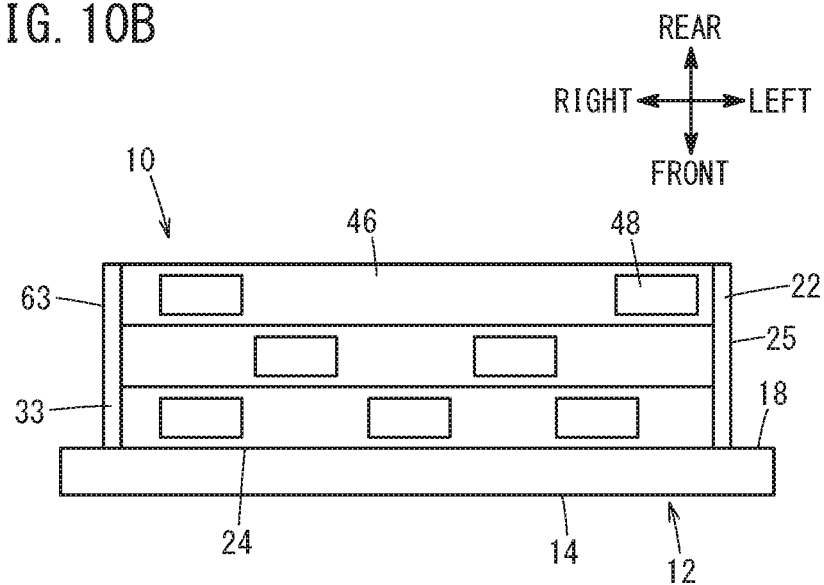

In FIGS. 10A and 10B, similarly to FIG. 9A, the lower face 33 of the housing 22 is formed with three steps in a stair-like manner in the rear-to-front direction with three parallel openings 34 (FIGS. 5 and 7) extending from left to right (one opening on each step). In this case, the main board 38 or the control board 168 having the same size is inserted into each of the three openings 34 (of slots 36). Therefore, each of the three openings 34 is closed with a cover 46 of the same size. Each of the three covers 46 is formed with plural connectors 50, to each of which a connector 48 is plugged.

Figure 11A:
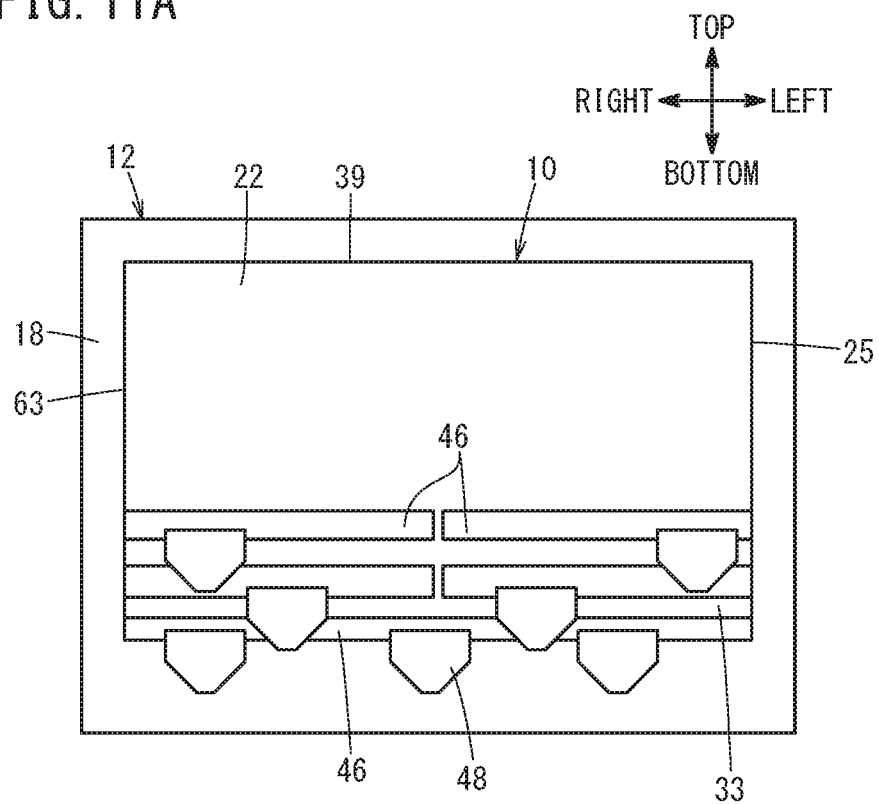
FIGS. 11A and 11B are a rear view and a bottom view, respectively, illustrating a schematic configuration of a controller of a variational example of FIG. 1.
Figure 11B:
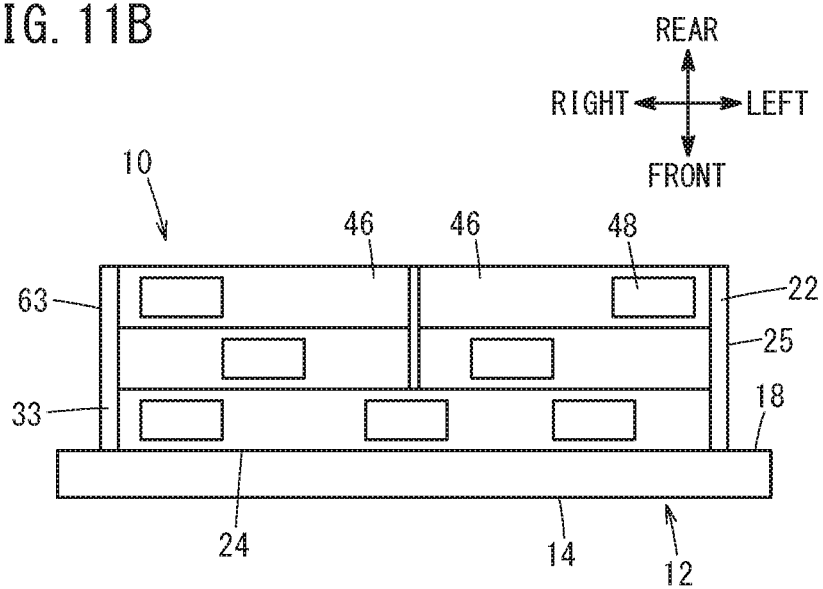

The configuration shown in FIGS. 11A and 11B is different from that shown in FIGS. 10A and 10B in that in the lower face 33 of the housing 22, the second and third steps to the rear from the back face 18 of the display device 12 are each formed with two openings 34 arranged left and right (see FIGS. 5 and 7), which are closed with covers 46 of the same size. In the second and third steps, each of the plural covers 46 is equipped with a control board 168 of the same size and one connector 50, to which a mating connector 48 is plugged in.

Figure 12A:
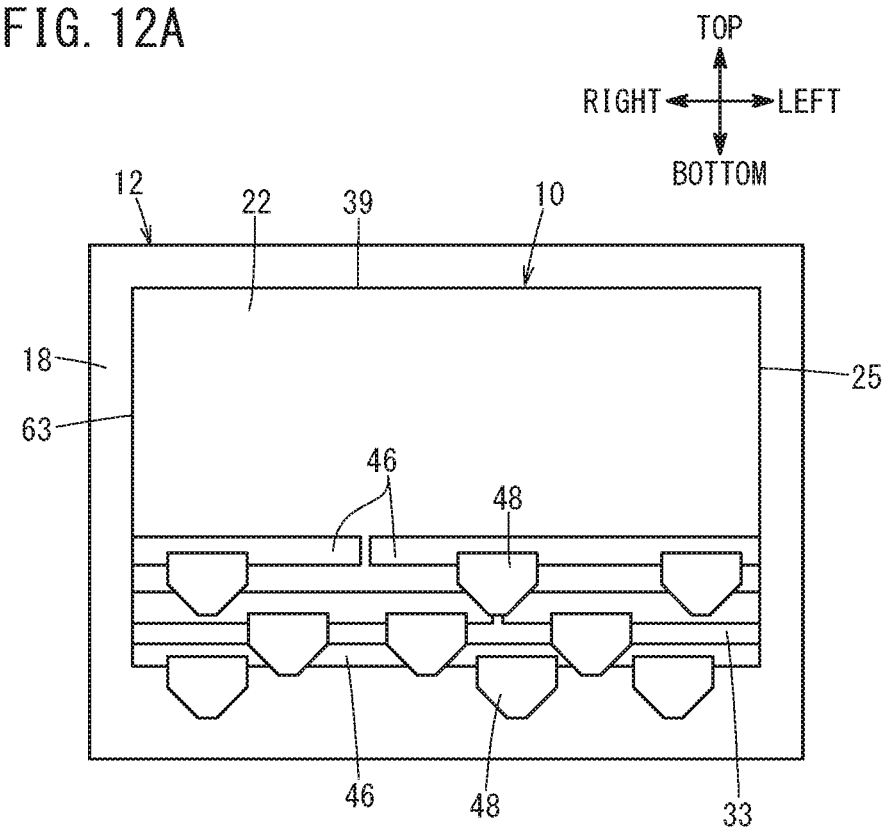
FIGS. 12A and 12B are a rear view and a bottom view, respectively, illustrating a schematic configuration of a controller of a variational example of FIG. 1.
Figure 12B:
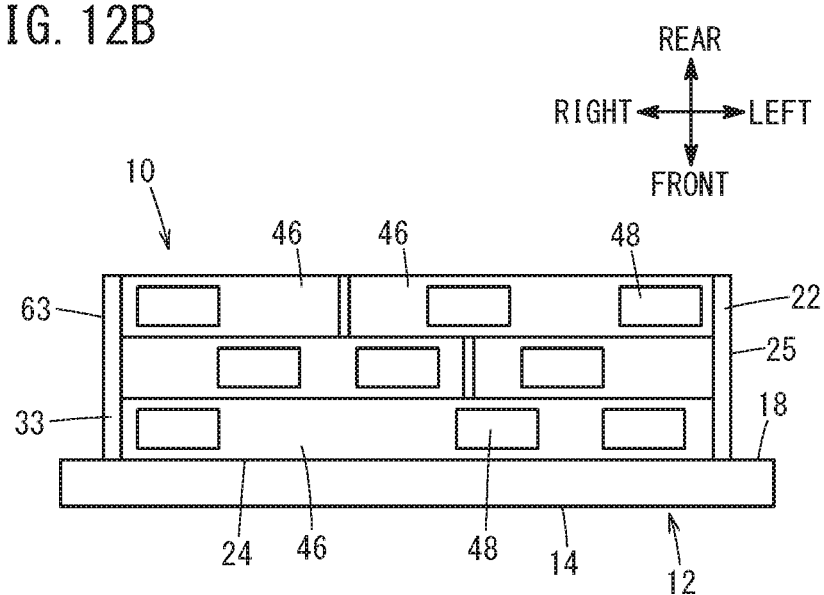

The configuration shown in FIGS. 12A and 12B is different from that shown in FIGS. 11A and 11B in that each of the second and third steps is formed with two left and right openings 34 (see FIGS. 5 and 7) of different sizes, which are closed with covers 46 of different sizes. In the second and third steps, the plural covers 46 are each equipped with a control board 168 of a different size.

Also, the configurations of FIGS. 10A to 12B can produce the same effects as the configuration of FIGS. 9A and 9B does.

[Configuration of Display Device 12 and User Interface Unit 20]

The display device 12 and the user interface unit 20 will be described with reference to FIGS. 1 to 6 and FIGS. 13 to 16.

As shown in FIGS. 4 and 16, the display device 12 has a control substrate 70 arranged on the back face 18 side of the display screen 16 (see FIG. 2) therein. The control substrate 70 has a connector 60 for creating connection of control substrate 70 itself with the controller 10 and a connector 72 for creating connection of control substrate 70 itself with the user interface unit 20, arranged on the opposite face thereof (the face on the back face 18 side) from the display screen 16. As shown in FIG. 2, the display device 12 includes a touch panel 71 provided on the front face 14 and a plurality of soft keys 73 arranged around the touch panel 71.

The control substrate 70 shown in FIGS. 4, 6 and 14 is a control unit that controls diverse components (e.g., the touch panel 71 and plural soft keys 73 in FIG. 2) in the display device 12. As shown in FIG. 3, a back plate 74 is mounted on the interior side of the left and right engagement parts 64 and the two positioning pieces 66 on the back face 18 of the display device 12. The control substrate 70 is covered from behind by the back plate 74 and accommodated in the display device 12. FIGS. 4 and 16 show a state in which the back plate 74 is removed from the display device 12.

As described above, the connector 60 is a connector to be connected to the connector 58 (see FIG. 6) of the controller 10. The connector 60 is provided at a higher position on the back face 18 side face of the control substrate 70, and is exposed to the rear through a partial cutaway in the back plate 74 (see FIG. 3). The connector 72 is provided at a lower portion of the back face 18 side face of the control substrate 70 and is exposed to the rear through a partial cutaway of the back plate 74. Therefore, on the back face 18 of the display device 12, two connectors 60, 72 for interface connection are provided at different places.

Formed near the connector 72 of the display device 12 is a rectangular opening 76 penetrating in the front-rear direction, as shown in FIGS. 4, 13, and 14. As shown in FIG. 2, a lid 78 covering the opening 76 from the front is provided on the front face 14 of the display device 12.

As shown in FIGS. 13 to 15, the user interface unit 20 includes a pouch-like resin case 80 that opens to the display device 12 side, an interfacing substrate 82 extended in the front-rear direction of the display device 12 and housed in the case 80, an interface connecting part 84 provided through one face (the face on the left side of the display device 12) and the other face (the face on the right side of the display device 12) of the interfacing substrate 82, another interface connecting part 86 provided on the one face of the interfacing substrate 82, and a connector 88 provided on the other face of the interfacing substrate 82. The two interface connecting parts 84, 86 are arranged vertically on the one face of the interfacing substrate 82. Further, the case 80 has a form which is bulged rightward to accommodate the connector 88.

The interface connecting part 84 is a USB (Universal Serial Bus) connector directed in the front-rear direction on the one face of the interfacing substrate 82. On the other hand, the interface connecting part 86 is a memory card slot directed in the front-rear direction on the one face of the interfacing substrate 82. Here, another kind of interface connector may be adopted for each of the interface connecting parts 84, 86.

The connector 88 is a connector to be coupled with the connector 72 of the control substrate 70. In this case, the connector 88 is preferably a floating connector in order to improve guiding for connection, absorbing of positional deviation and insertion performance at the time of connection with the connector 72. As described above, the interfacing substrate 82 extends in the front-rear direction of the display device 12, whereas the control substrate 70 extends in parallel with the back face 18 of the display device 12. Therefore, connection between the connector 72 on the control substrate 70 and the connector 88 of the user interface unit 20 preferably employs a perpendicular connector assembly.

Here, as described above, when the controller 10 is attached to the back face 18 of the display device 12, the connector 58 of the controller 10 and the connector 60 of the control substrate 70 are connected.

On the other hand, when the user interface unit 20 is brought close to the back face 18 of the display device 12 and the connector 88 is connected to the connector 72 of the control substrate 70, the interfacing substrate 82 is arranged perpendicularly to the control substrate 70 and connected to the control substrate 70 as it is. Thus, the user interface unit 20 is attached to the back face 18 of the display device 12. In this case, the opening 76 and the connector 88 are covered from behind by the case 80. Further, the two interface connecting parts 84, 86 are disposed in the opening 76.

Accordingly, when the operator faces the front side of the display device 12 and opens the lid 78, the two interface connecting parts 84, 86 can be seen through the opening 76. The operator can insert a USB connector 90 into the interface connecting part 84 from the front face 14 of the display device 12 through the opening 76. The USB connector 90 is connected to an external device such as a memory or a keyboard. Further, the operator can insert a memory card 92 such as a SD (Secure Digital) card into the interface connecting part 86 from the front face 14 of the display device 12 through the opening 76.

In this way, in this embodiment, it is possible to connect the display device 12 with the controller 10 and connect the display device 12 with the USB connector 90 and the memory card 92 with a simple configuration. Further, since the operator can easily access the two interface connecting parts 84, 86 through the opening 76, it is possible to more easily connect the interface connecting parts 84, 86 with the USB connector 90 and the memory card 92. Moreover, the control substrate 70 can output signals or information from the controller 10 to the external device via the USB connector 90 via the connectors 72, 88, the interfacing substrate 82 and the interface connecting parts 84, 86, or store the information in the memory card 92. Note that the memory card 92 storing information is taken out from the interface connecting part 86 and connected to external devices.

In this case, since the two connectors 72, 88 are provided so that the interfacing substrate 82 can be connected perpendicularly (at a right angle) to the control substrate 70, the user interface unit 20 can be connected to the control substrate 70 in a limited space in the back face 18 of the display device 12. Moreover, since connection between the two connectors 72, 88 employs a perpendicular connector assembly, the control substrate 70 and the interfacing substrate 82 can be easily connected perpendicularly.

Here, when the user interface unit 20 is pulled out rearward while the user interface unit 20 and the control substrate 70 are connected, the connection between the two connectors 72, 88 is released and the user interface unit 20 can easily be detached from the back face 18 of the display device 12. In this way, the display device 12 is configured so as to allow the user interface unit 20 to be removed. As a result, the depth or dimension in the front-rear direction of the display device 12 becomes smaller, which makes the display device 12 easy to transport.

In FIGS. 2, 13 and 14, the opening 76 and the lid 78 are provided so that the operator can access the interface connecting parts 84, 86 from the front face 14 of the display device 12. However, the opening 76 and the lid 78 may be provided on a side face of the display device 12. Also in this case, the operator can open the lid 78 from the side of the display device 12 and access the interface connecting parts 84, 86 of the user interface unit 20 through the opening 76.

The user interface unit 20 further includes a holding member 94 and a sealing member 96. The holding member 94 is attached to the opening of the case 80 and accommodates the interfacing substrate 82 in the case 80. An opening through which the USB connector 90 and the memory card 92 are inserted is formed in the holding member 94. By connecting the two connectors 72, 88, the sealing member 96 seals between the user interface unit 20 and the control substrate 70 when they are connected.

As a result, when the lid 78 is open and the opening 76 is exposed, it is possible to prevent foreign matter such as cutting fluid of the machine tool from entering from the outside through the opening 76 and contaminating the control substrate 70 and the interfacing substrate 82. Here, the sealing member 96 may be attached to the brim of the case 80 or may be disposed on the control substrate 70 so as to surround the opening 76.

It should be noted that connection between the display device 12 and the user interface unit 20 is not limited to use of a perpendicular connector assembly (connectors 72, 88), but another connection method such as use of a flexible cable can be applied.

[Attaching and Detaching Structures of Controller 10, Fan 26, and Fan Unit 28]

Referring now to FIGS. 16 to 20, the attaching and detaching structures of the controller 10, the fan 26, and the fan unit 28 will be described.

As described above, the controller 10 is detachably attached to the back face 18 of the display device 12. Therefore, it is preferable that the same controller 10 can be used in both the state where the controller 10 and the display device 12 are integrated as shown in FIG. 1 and the state where the controller 10 and the display device 12 are separated as shown in FIG. 17.

For this purpose, as shown in FIG. 17 and FIG. 18, when the controller 10 is separated from the back face 18 of the display device 12, the housing 22 is supported by attaching a support member 100 to the housing 22. The housing 22 is provided with a support member attachment structure 102 for attachment to the support member 100. The support member attachment structure 102 is provided on the top face 39 located opposite from the lower face 33 of the housing 22 in which the slots 36 (see FIGS. 5 and 7) are formed.

The support member 100 is a plate-like bracket attached to the top face 39 of the housing 22. The support member 100 has an attachment face 106 extending in the longitudinal direction thereof and abutting the top face 39 of the housing 22. Provided on the attachment face 106 are four projections 108 projecting toward the top face 39 of the housing 22 and two engagement claws 110 arranged on both sides with respect to the length of the attachment face 106. Mounting holes 112 are formed at both longitudinal ends of the support member 100. In this case, the support member 100 can be mounted to an unillustrated mounting object by inserting unillustrated joint members through the mounting holes 112 and fixing the joint members to the mounting object (not shown).

On the other hand, the support member attachment structure 102 provided on the top face 39 of the housing 22 includes a plurality of holes 114 formed on the left and right sides of the top face 39 to receive the plural projections 108 (i.e., the projections 108 being fitted into the holes 114), and two engagement recesses 116 formed on the left and right sides of the top face 39 to engage with the two engagement claws 110.

Here, the controller 10 is detached from the back face 18 of the display device 12, and with the attachment face 106 of the support member 100 opposed to the top face 39 of the housing 22 of the controller 10, the support member 100 is moved to approach the housing 22. As a result, while the plural projections 108 are fitted into the plural holes 114, the two engagement claws 110 and the two engagement recesses 116 become engaged with each other, whereby the housing 22 is attached to the support member 100. Next, by inserting joint members (not shown) through the mounting holes 112 and fixing the joint members to the mounting object, the controller 10 is fixed to the mounting object via the support member 100.

As the controller 10, which has been fixed to the mounting object via the support member 100, is pulled in such a direction as to separate from the support member 100, the two engagement claws 110 are released from the two engagement recesses 116, thus the controller 10 can be easily detached from the support member 100.

As described above, the support member attachment structure 102 is formed on the top face 39 of the housing 22, different from the bottom face 24 of the housing 22 to be attached to the back face 18 of the display device 12, and the lower face 33 of the housing 22 where slots 36 are formed. In this case, in a state where the controller 10 is detached from the back face 18 of the display device 12, the controller 10 attached to the support member 100 via the support member attachment structure 102, is supported on the mounting object via the support member 100. Thereby, the housing 22 can be easily attached to and detached from the support member 100 without affecting insertion/removal of the main board 38 and the control boards 168 and attachment/detachment of the controller 10 to/from the back face 18 of the display device 12. As a result, it is possible to use the same controller 10 both in the integrated state of the controller 10 and the display device 12 and in their separated state.

As shown in FIGS. 4, 17, 19 and 20, the controller 10 further has, on the side face 25 of the housing 22, a fan attaching structure 120 for detachably attaching the fans 26 and the fan unit 28 to the housing 22.

The fan attaching structure 120 includes an attaching portion 122 extending from the bottom plate 22*b* (see FIGS. 5 and 6) of the housing 22 to the left of the housing 22, an extended portion 124 extended in the casing body 22*a* to the left on the top face 39 side of the housing 22, a stepped portion 126 formed on a surface (the surface on the lower face 33 side) opposite to the top face 39 of the extended portion 124, a connecting part 128 such as a connector provided in the stepped portion 126, an engagement recess 130 formed close to the lower face 33 side on the side face 25 of the housing 22.

It is preferable that the connecting part 128 is electrically connected to the backboard 32 (see FIGS. 5 to 7). Further, the connecting part 128 is connected to a connecting part such as a connector (not shown) of the fan unit 28 when the fan unit 28 is attached to the side face 25 of the housing 22. Therefore, the connecting part 128 needs to be arranged at a position of the housing 22 so as to come into contact with the fan unit 28 when the fan unit 28 is attached to the side face 25 of the housing 22. The connecting part of the fan unit 28 is electrically connected to the two fans 26 housed in the fan unit 28. Thus, the two fans 26 accommodated in the fan unit 28 can be driven by the main board 38 and the plural control boards 168 via the backboard 32, the connecting part 128 and the connecting part of the fan unit 28.

The fan unit 28 is a rectangular casing that extends in the vertical direction of the housing 22 and is capable of accommodating two fans 26. Formed on the face (the face distant from the display device 12) of the fan unit 28 on the side opposite to the attaching portion 122 is an opening 132 for placing the two fans 26. The two fans 26 are inserted into the fan unit 28 through the opening 132, and are set side by side in the longitudinal direction of the fan unit 28 (the vertical direction of the housing 22).

In this case, in the state where the fan unit 28 is attached to the housing 22, the two fans 26 each generate an air current in the lateral (right-left) direction inside the housing 22 (the direction orthogonal to the longitudinal direction of the fan unit 28). Therefore, the side face 25 of the housing 22 has two openings 134 (see FIGS. 4 and 20) having shapes and sizes corresponding to the two fans 26, formed adjacently above and below. In this case, it is preferable that an opening (not shown) is also formed on the side face 63 of the housing 22.

A grating 136 of slits having a shape and size corresponding to the two fans 26 is formed on the side face 61 of the fan unit 28. In the side face 61 of the fan unit 28, the above-described engagement claw 62 is arranged on the attaching portion 122 side of the side face 61 so as not to overlap the grating 136.

In the state where the fan unit 28 is attached to the side face 25 of the housing 22, as the two fans 26 are driven, air current is generated in the housing 22 in the lateral direction. The generated air flow cools the control unit 30 (see FIGS. 5 to 7) and others, which emit heat in the housing 22, and is discharged to the outside through the two openings 134, the two fans 26 and the grating 136.

A bottom face 138 on the side opposite to the surface on which the opening 132 of the fan unit 28 is formed is placed on the attaching portion 122 (see FIGS. 4 and 20). Further, the top face 39 side of the fan unit 28 is formed in a stepped shape so as to mate with the extended portion 124 and the stepped portion 126. Further, on the top face 39 side of the fan unit 28, an unillustrated connecting part connectable to the connecting part 128 is provided.

Furthermore, on the lower face 33 side of the fan unit 28, a left corner portion is depressed. Thereby, this makes it possible to avoid interference between the fan unit 28 and the user interface unit 20 when the user interface unit 20 is attached to the back face 18 of the display device 12 after the housing 22 with the fan unit 28 attached is attached to the back face 18 of the display device 12. Additionally, an engagement claw 140 capable of engaging with the engagement recess 130 is provided on the lower face 33 side of the fan unit 28.

Here, as shown in FIGS. 4 and 20, the fan unit 28 can be attached to and detached from the housing 22 in the vertical direction (the direction along the bottom face 24 of the housing 22). Further, as shown in FIG. 19, the two fans 26 can be attached to and detached from the fan unit 28 in the front-rear direction (the direction normal to the bottom face 24 of the housing 22).

The fan unit 28 can be attached to or detached from the housing 22 in the vertical direction in both the state where the controller 10 is attached to the back face 18 of the display device 12 as shown in FIGS. 1 and 19, and the state where the controller 10 is separated from the back face 18 of the display device 12 as shown in FIG. 20.

Here, in a case where the housing 22 is attached to the back face 18 of the display device 12, the fan unit 28 can be attached to and detached from the side face 25 of the housing 22 in the vertical direction when the user interface unit 20 has been detached from the back face 18 of the display device 12.

First, the case where the fan unit 28 is attached to the side face 25 of the housing 22 will be described. As shown in FIG. 20, the fan unit 28 is brought close to the housing 22 with the extended portion 124 and the stepped portion 126 of the housing 22 opposed to the top face 39 side of the fan unit 28 in the vertical direction. As a result, the bottom face 138 of the fan unit 28 contacts the attaching portion 122, and the side face of the fan unit 28 on the engagement claw 140 side contacts the side face 25 of the housing 22. Next, the fan unit 28 is moved along the side face 25 of the housing 22 and the attaching portion 122 toward the extended portion 124 and the stepped portion 126. As a result, the top face 39 side of the fan unit 28 is brought into contact with the extended portion 124 and the stepped portion 126 so that the connecting part 128 and the connecting part of the fan unit 28 are connected while the engagement claw 140 becomes engaged with the engagement recess 130. Thereby, the fan unit 28 is attached to the side face 25 of the housing 22.

On the other hand, when the fan unit 28 is detached from the side face 25 of the housing 22, the fan unit 28 is moved along the attaching portion 122 away from the extended portion 124 and the stepped portion 126 in a state where the engagement claw 140 is released from the engagement recess 130. As a result, the connection between the connecting part 128 and the connecting part of the fan unit 28 is released. As the fan unit 28 is further moved downward, the fan unit 28 can be detached from the side face 25 of the housing 22.

The two fans 26 are attached to and detached from the fan unit 28 via the opening 132. As described above, since the fan unit 28 can be attached to and detached from the side face 25 of the housing 22 by vertical movement, the directions of attachment and removal of the fan unit 28 with respect to the housing 22 and the directions of attachment and removal of the two fans 26 with respect to the fan unit 28 are different from each other.

In this way, since the fan attaching structure 120 enables the fan unit 28 having the fans 26 therein to be attached to and detached from the housing 22, the fans 26 and the fan unit 28 can be easily replaced. Further, when the controller 10 and the display device 12 are used in a state of either being integrated or separated, it is possible to easily cool the control unit 30 which emits heat inside the housing 22.

Moreover, since the fan attaching structure 120 is arranged on the side face 25, which is different from the bottom face 24 of the housing 22 attached to the back face 18 of the display device 12 and the lower face 33 of the housing 22 in which slots 36 are formed, the fans 26 and the fan unit 28 can be attached to and detached from the housing 22 without affecting insertion and removal of the main board 38 and the plural control boards 168 and attachment of the housing 22 to the back face 18 of the display device 12. Furthermore, since the fans 26 are detachably attached to the fan unit 28, the fan 26 can be easily replaced.

When the fan unit 28 is attached to the side face 25 of the housing 22 by the fan attaching structure 120, the directions in which the fans 26 are attached to and detached from the fan unit 28 are made different from the directions in which the fan unit 28 is attached to and detached from the side face 25 of the housing 22. Accordingly, replacement of the fan unit 28 for the housing 22 and replacement of fans 26 for the fan unit 28 can be performed more easily.

In this case, the fan unit 28 can be detached from the housing 22 by movement in a direction along the bottom face 24 of the housing 22 opposing the back face 18 of the display device 12. Further, the fans 26 can be detached from the fan unit 28 by movement in a direction away from the bottom face 24 of the housing 22. Thereby, the fans 26 and the fan unit 28 can be replaced efficiently.

The advantage of this configuration can be obtained as long as the directions in which the fans 26 are attached to and detached from the fan unit 28 and the directions in which the fan unit 28 is attached to and detached from the side face 25 of the housing 22 are different from each other. Therefore, instead of the above configuration, the fan unit 28 may be attachable and detachable by front-rear movement with respect to the housing 22 while two fans 26 may be detachably attached to the fan unit 28 in the vertical direction. Even in this case, the above effect can be easily obtained.

[Configuration of Display-Equipped Controller 150]

Referring next to FIG. 21 to FIG. 27, a display-equipped controller 150 (hereinafter also simply referred to as a controller 150) will be described.

This controller 150 is different from the controller 10 of FIGS. 1 to 20 in that the controller has a display device 12 with no backboard 32 attached. The controller 150 includes a display device 12, a housing 151 disposed on the back face, designated at 18, of the display device 12, a main board 152 and a radiator 154 supported by the housing 151.

The housing 151 is an attaching structure for attaching the main board 152 and the radiator 154 to the back face 18 of the display device 12. As shown in FIGS. 21, 22 and 24 to 27, the housing 151 includes a frame 156 forming four side faces (side faces 25, 63, a lower face 33, a top face 39) and a bottom plate 158 connected to the frame 156 and forming a bottom face 24. A portion of the frame 156 on the side opposite to the display device 12 is formed as a stepped portion 160 projecting rearward from the housing 151. Further, as shown in FIGS. 22 and 25 to 27, the stepped portion 160 is provided with an engagement claw 162 that projects rearward. The details of FIGS. 25 to 27 will be described later.

The radiator 154 is provided to discharge heat from the heating elements in the controller 150 such as the main board 152 to the outside and is attached to the stepped portion 160 by being engaged with an engagement claw 162.

Figure 21:
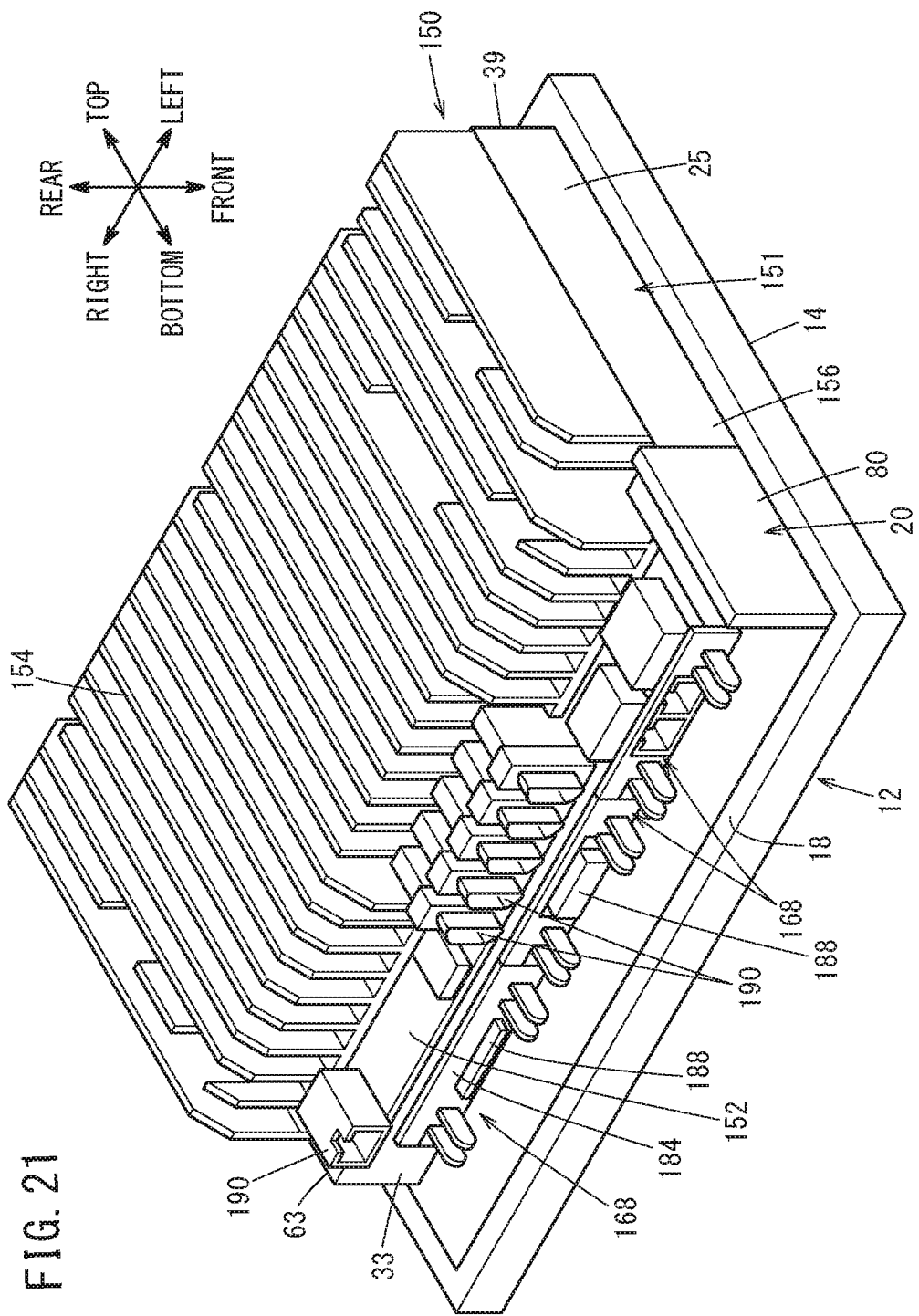
FIG. 21 is a perspective view of a display-equipped controller.
Figure 22:
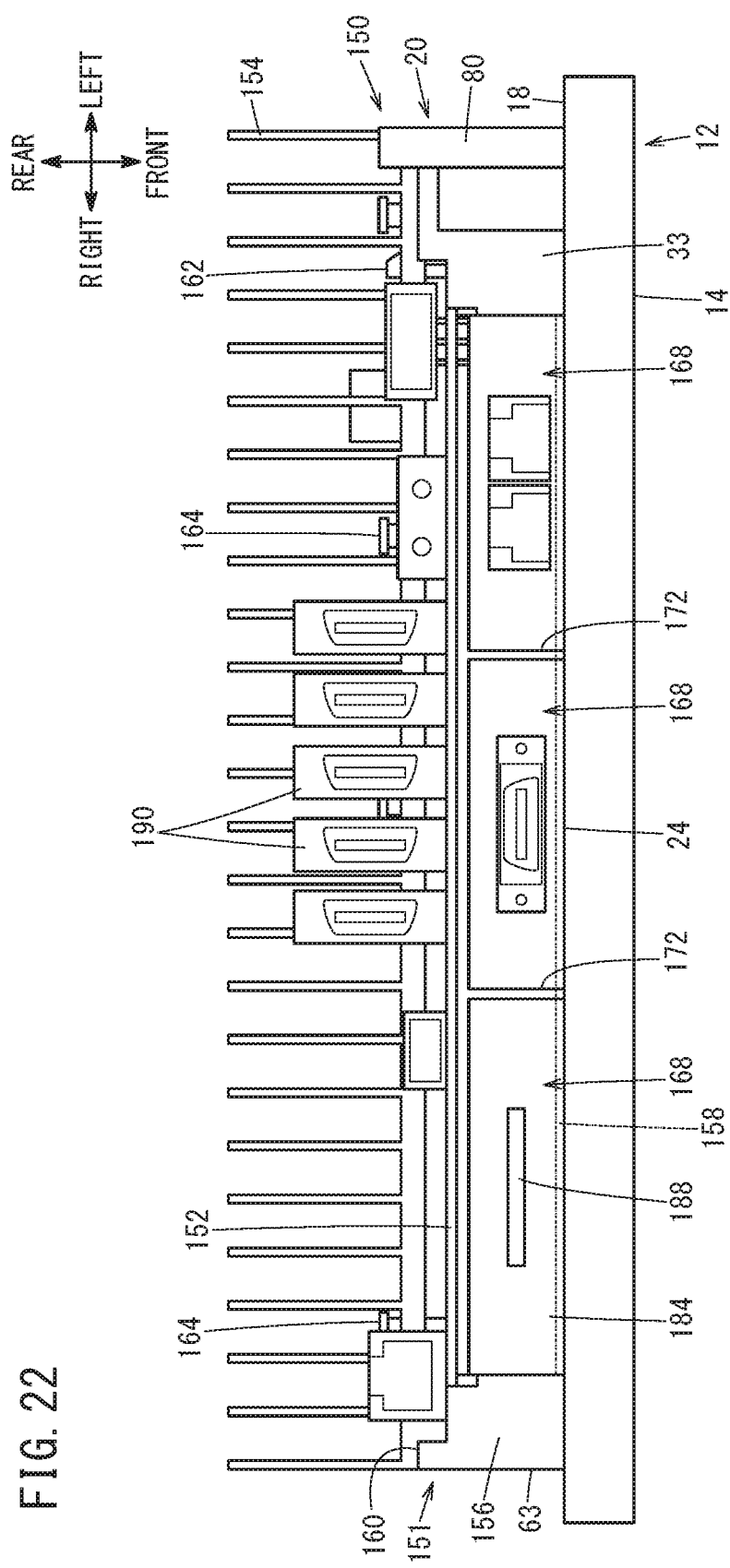
FIG. 22 is a bottom view of the display-equipped control unit shown in FIG. 21.

As shown in FIGS. 21 and 22, the radiator 154 has large radiating fins covering the main board 152 from behind. The main board 152 is a control substrate for controlling the display device 12 and is attached to the radiator 154 by joint parts 164 such as push pins so that the main board is disposed between the radiator 154 and the back face 18 of the display device 12. Here, the main board 152 is a control substrate greater in size than an after-mentioned control board 168.

In this case, the main board 152 is arranged between the radiator 154 and the back face 18 of the display device 12 and supported by the joint parts 164 from the radiator 154. As a result, the main board 152 is arranged in the controller 150 so as to be parallel with the back face 18 and spaced from the back face 18 of the display device 12 at a predetermined distance. Further, the radiator 154 is disposed opposite from the display device 12 with respect to the main board 152 (behind the main board 152) so as to cover the main board 152 from the rear, being parallel with the back face 18 and spaced from the back face 18 of the display device 12 at a predetermined distance.

Figure 23:
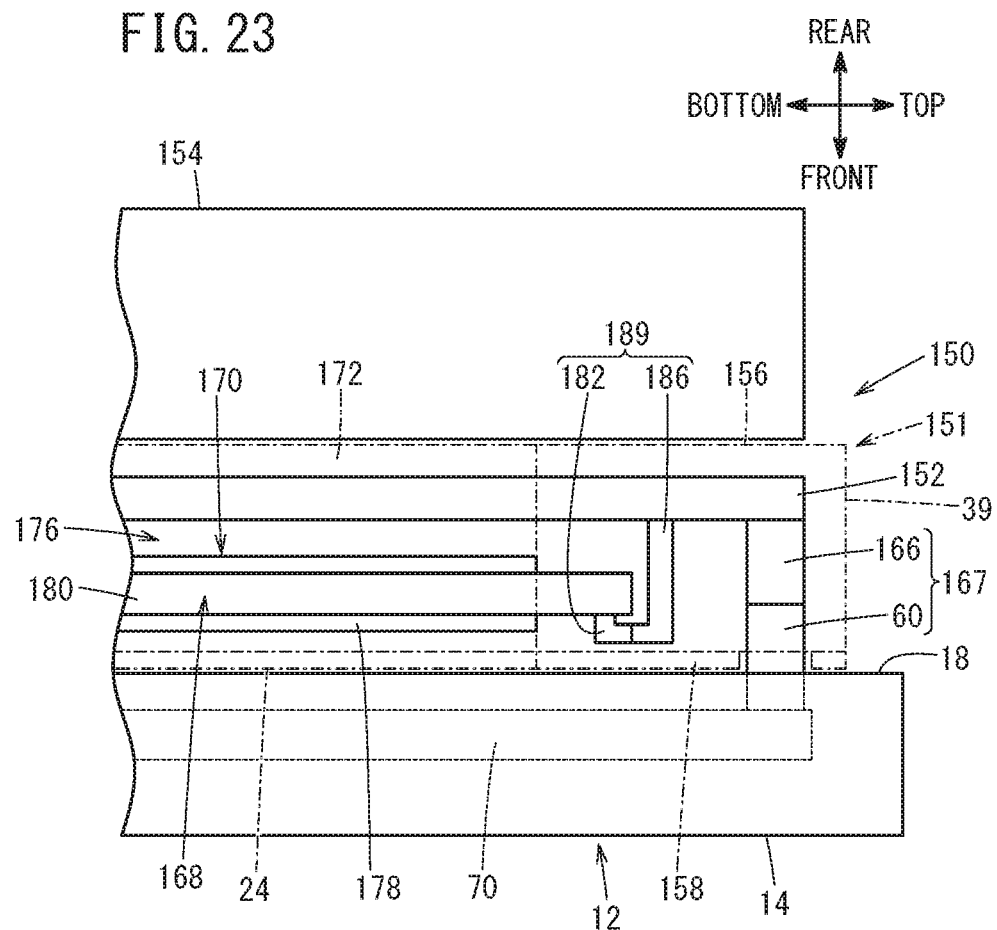
FIG. 23 is a conceptual diagram illustrating the connection between a main board and a control board and the connection between the main board and a display device in a side view.

Provided on the top face 39 side of the main board 152 is a connector 166 connected to the connector 60 of the display device 12, as shown in FIG. 23. In this case, the connector 60 of the display device 12 and the connector 166 of the main board 152 constitute a junction 167 for electrically connecting the display device 12 and the main board 152. The junction 167 is preferably of a parallel connector assembly. Thereby, the main board 152 can control the display device 12 via the junction 167 (the connectors 60, 166).

In the controller 150, a plurality of control boards 168 are removably inserted into the space between the main board 152 and the bottom plate 158. The controller 150 includes a support structure 170 that detachably supports plural control boards 168 between the main board 152 and the bottom plate 158. The plural control boards 168 of the controller 150 have similar configuration as those of the controller 10 shown in FIGS. 1 to 20. Thereby, the control boards 168 can be commonly used by the controller 150 and the controller 10.

Figure 24:
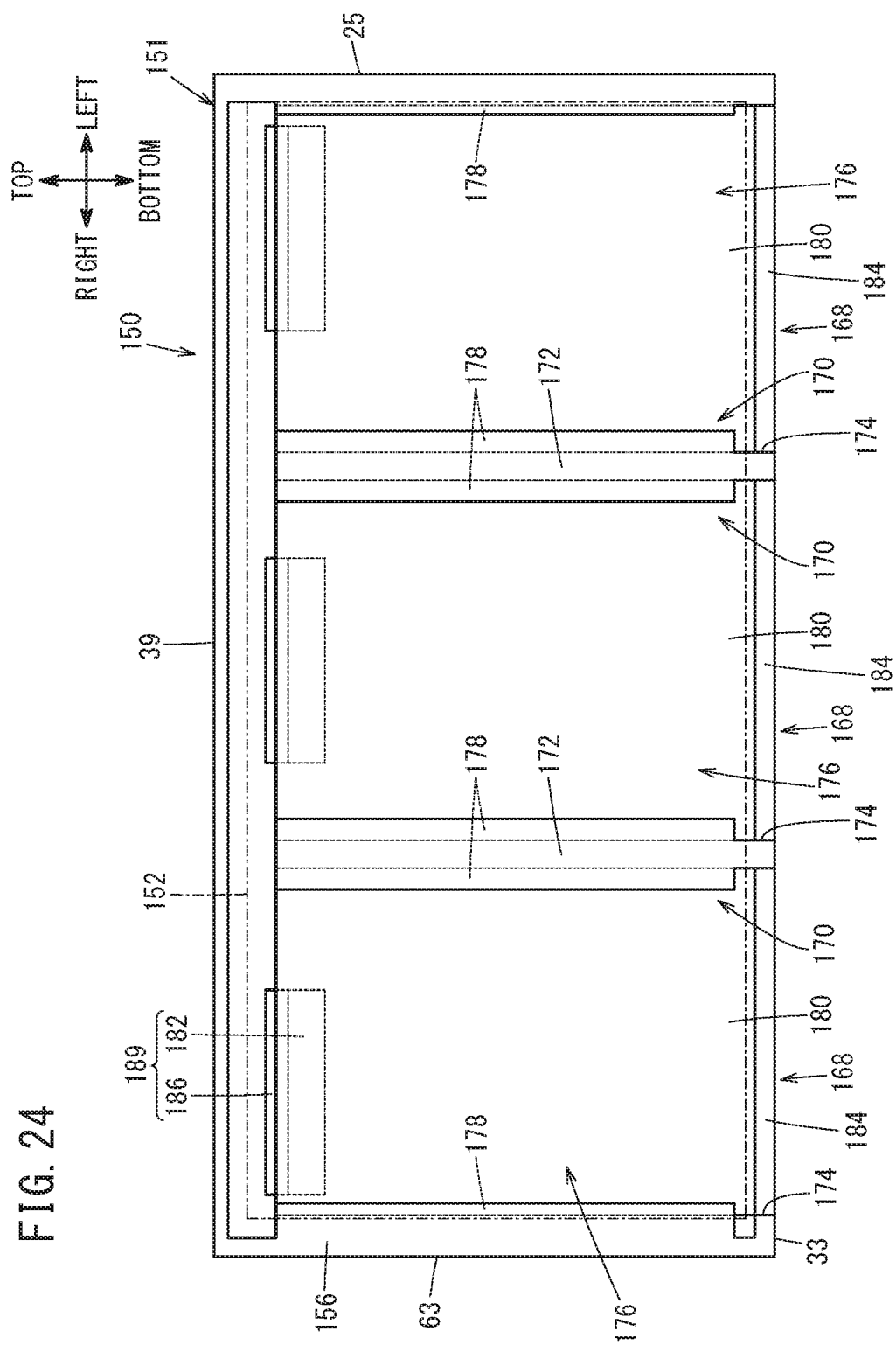
FIG. 24 is a conceptual diagram illustrating the connection between a main board and a control board in a rear view.

As shown in FIGS. 22 to 24, the space between the main board 152 and the bottom plate 158 is divided into a plurality of chambers by plural partition plates 172 extending in the vertical direction. Formed in the lower face 33 of the housing 151 are a plurality of openings 174 communicating with the plural chambers. Thus, each of the plural chambers is formed as a slot 176 extending in the vertical direction. The plural control boards 168 are each accommodated in the plural slots 176 such that the control boards 168 are insertable into and removable from the slots 176, respectively. FIG. 24 is a conceptual view showing the storage state of the plural control boards 168 in the housing 151 when viewed from the rear.

The support structure 170 is provided in each of the plural slots 176 and has guides 178 arranged in the vertical direction on the partition plates 172 or the frame 156. In each of the plural slots 176, the guides 178 on the left and right sides each are a guide rail and guide the control board 168 inserted into the slot 176 in the vertical direction up to the top face 39 side of the housing 151 (a point near the connector 166 in FIG. 23). Use of the guides 178 makes it unnecessary to position the control boards 168 with respect to the front-rear direction and the right-left direction when they are inserted into the slot 176.

Each of the plural control boards 168 includes a substrate 180 extending in the vertical direction and guided by the left and right guides 178, a connector 182 provided on the substrate 180 on the side close to the connector 166, and a cover 184 arranged on the opposite side of the connector 182 on the substrate 180. When the control board 168 is inserted into the slot 176, the cover 184 abuts the lower face 33 of the housing 151 to close the opening 174. Also in the controller 150, formation of the control board 168 into a unit facilitates the control board 168 to be packaged and transported and also makes it easy to take electrostatic countermeasures for the control boards 168.

As conceptually illustrated in FIG. 24, also in the controller 150, as to each of the control boards 168, the connector 182 on each substrate 180 is arranged so that the attachment position of the connector 182 relative to the control board 168 differs from the attachment positions of the other connectors when the plural control boards 168 are viewed from the vertical direction (the direction of insertion). Accordingly, also in the controller 150, the effect thanks to differentiating the attachment positions of the connectors 182 can be easily obtained. Also for the attachment positions of the connectors 182, the connectors may be shifted in either the right-left direction or the front-rear direction. In addition, the connector 182 is preferably a floating connector in order to improve guiding for connection, absorbing of positional deviation and insertion performance at the time of connection with an after-mentioned connector 186 formed on the main board 152. Further, the plural control boards 168 each have a connector 188 which is exposed to the outside through the cover 184 and connected to an external connector.

As shown in FIG. 23, a plurality of connectors 186 are attached to the bottom face of the main board 152, at positions opposing the plural control boards 168. The plural connectors 186 are each connected to the connector 182 of the associated one of the plural control boards 168 inserted in the plural slots 176. In this case, the connector 182 on the control board 168 and the connector 186 on the main board 152 constitute a junction 189 for electrically connecting the main board 152 and the control board 168. The junction 189 is preferably of a parallel connector assembly. Further, as shown in FIGS. 21 and 22, a plurality of connectors 190 to be connected to external connectors are arrayed on the face of the main board 152 that opposes the radiator 154, near the edge of the lower face 33.

Then, as shown in FIGS. 21 to 24, as the substrate 180 is inserted into the slot 176 for each of the plural control boards 168, the inserted substrate 180 can be moved to the connector 186 along the guides 178 on the left and right sides. As a result, the connector 182 of the control board 168 and the connector 186 of the main board 152 are engaged with each other (e.g., by fitting) so that the control board 168 and the main board 152 are electrically connected. Further, as the control board 168 moves to the connector 186, the cover 184 abuts the lower face 33 of the housing 151 to close the opening 174 of the slot 176.

On the other hand, when the cover 184 of the control board 168 held in the slot 176 and electrically connected to the main board 152 is pulled downward, the connector 182 is separated from the connector 186 so that the control board 168 can be pulled out of the slot 176 along the left and right guides 178.

In this manner, the controller 150 is constructed such that the control boards 168 are removably inserted into the space (slots 176) between the main board 152 and the bottom plate 158 of the housing 151 on the back face 18 side of the display device 12 while the radiator 154 is laid out behind the main board 152. As a result it is possible to arrange the control boards 168 and the radiator 154 efficiently in the controller 150.

In addition, since the support structure 170 having the guides 178 for guiding the insertion of the control board 168 is provided in the housing 151, the control board 168 can be easily inserted into and pulled out from the slot 176.

Furthermore, since the support structure 170 is provided for each of the plural slots 176, each of the plural control boards 168 can be easily inserted into and pulled out from the slots 176. In this case, the plural slots 176 are arranged in parallel along the back face 18 of the display device 12 while the support structure 170 is provided for each of the plural slots 176, so that the plural control boards 168 can be efficiently inserted and pulled out.

Since the housing 151 itself constitutes the attaching structure for attaching the main board 152 and the radiator 154 to the back face 18 of the display device 12, and also includes the support structure 170 as a part thereof, the housing 151 as the attaching structure and the support structure 170 are integrated. Thereby, the number of parts of the controller 150 can be reduced.

Further, since the junction 167 (connectors 60, 166) is of a parallel connector assembly, it is possible to easily connect the control substrate 70 arranged parallel to the back face 18 of the display device 12 with the main board 152. Furthermore, since the junction 189 (connectors 182, 186) is of a horizontal connector assembly, the control board 168 and the main board 152 can be easily connected when the control board 168 is inserted into the slot 176.

Figure 25:
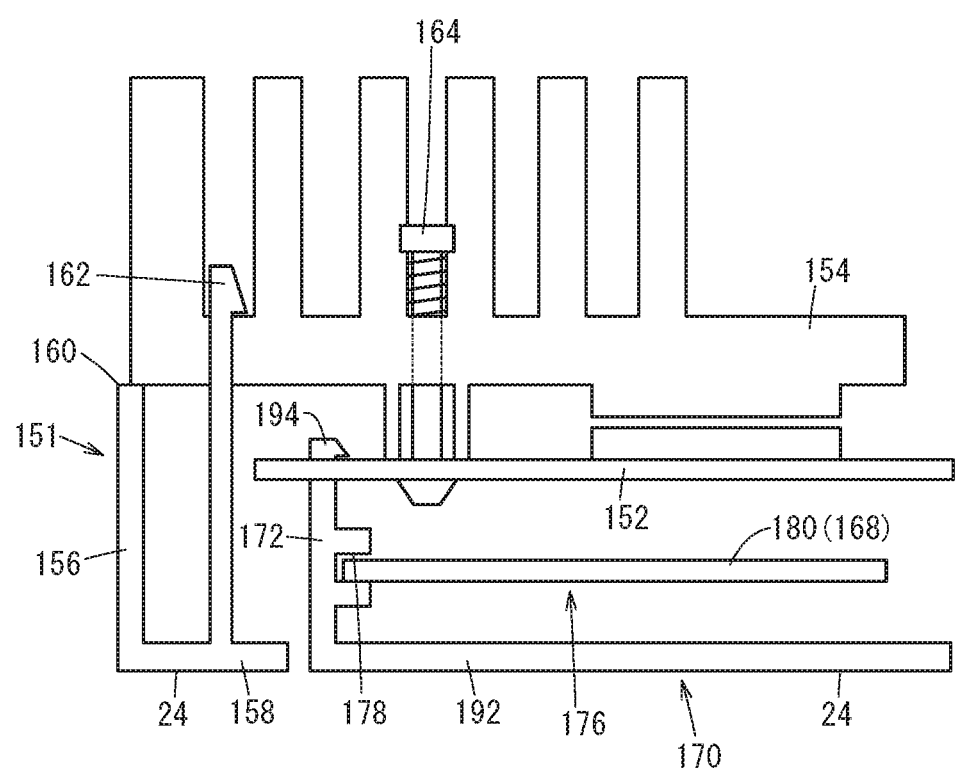
FIG. 25 is a conceptual diagram illustrating a support structure of a control board.
Figure 26:
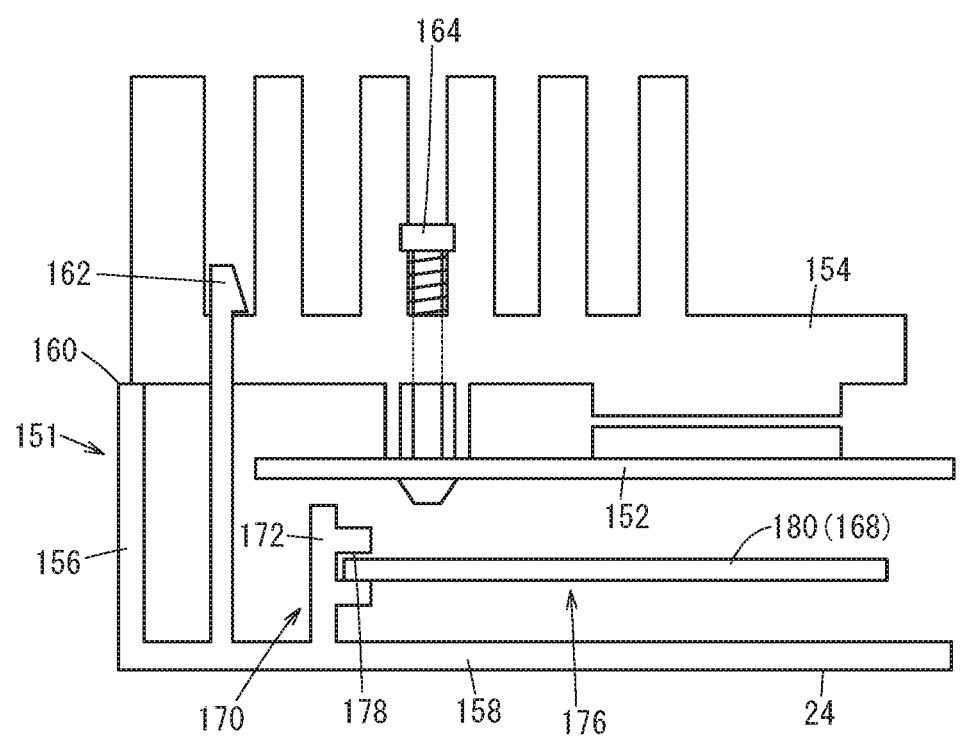
FIG. 26 is a conceptual diagram illustrating a support structure of a control board.
Figure 27:
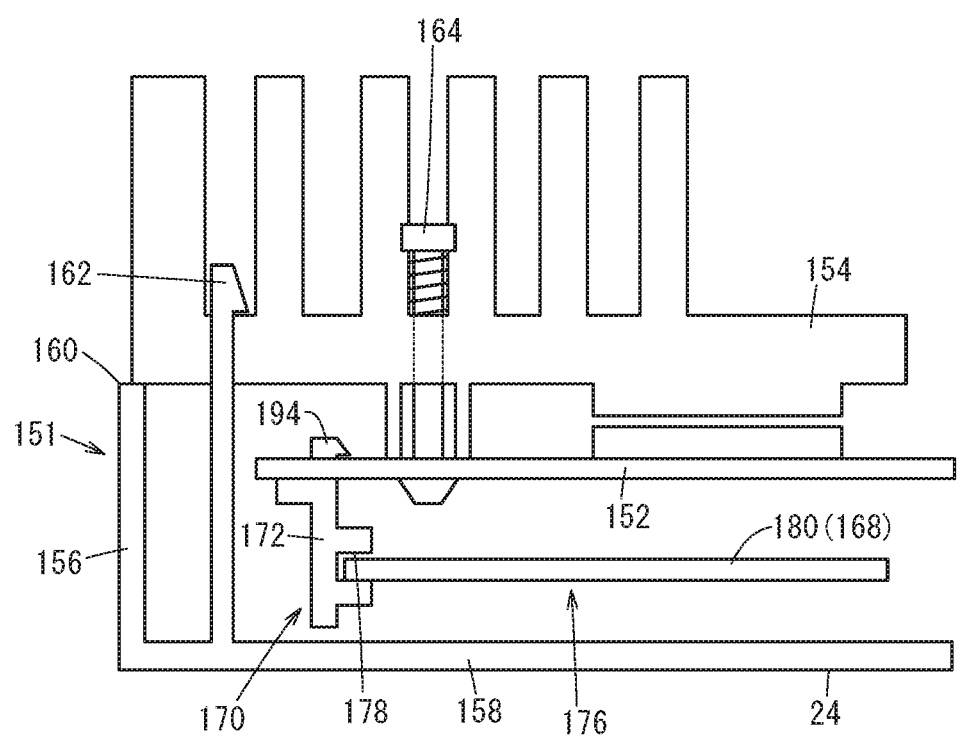
FIG. 27 is a conceptual diagram illustrating a support structure of a control board.

The support structure 170 can be configured as shown in FIGS. 25 to 27.

In FIG. 25, the support structure 170 is attached to the main board 152 while the housing 151 and the support structure 170 are separated. In this case, the support structure 170 includes a bottom plate 192, partition plates 172 joined to the bottom plate 192 and having guides 178 formed thereon, and an engagement claw 194 formed on each of the partition plates 172 at the end on the main board 152 side and engaging with the main board 152. In this structure, when a trouble takes place with the support structure 170, it is possible to replace the support structure 170 alone, so that maintainability of the controller 150 can be improved.

In FIG. 26, the partition plate 172 is extended from the bottom plate 158 of the housing 151 toward the main board 152 so that the support structure 170 is integrally formed with the housing 151. In this case, the support structure 170 is not connected to the main board 152.

In FIG. 27, the partition plate 172 is extended from the main board 152 toward the bottom plate 158, and the housing 151 and the support structure 170 are separated. In this case, the support structure 170 is integrally formed with the main board 152, being hung down from the main board 152.

In any of the configurations, the support structure 170 has the guides 178, the aforementioned advantage can be easily obtained.

In the above description, the attaching structure for attaching the main board 152 and the radiator 154 to the back face 18 of the display device 12 is not limited to the above-described housing 151. For example, the main board 152 and the radiator 154 may be supported on the back face 18 of the display device 12 by support members such as plural support columns. As for the electrical connection between the display device 12 and the main board 152, other connecting means such as a flexible cable may be used in place of the above-described connectors 60, 166.

[Technical Idea Obtained from the Embodiment]

Technical ideas that can be grasped from the above embodiment will be described below.

The controller (10) which is attached to the back face (18) of the display device (12) includes: the housing (22); the control unit (30) accommodated in the slot (36) formed in the housing (22) and configured to control the display device (12), the control unit (30) being insertable into and removable from the slot (36); the backboard (32) provided inside the housing (22) on the interior side with respect to the direction of insertion of the control unit (30) and connected to the control unit (30); the first connector (60) provided for the display device (12); and the second connector (58) connected to the first connector (60) to establish connection between the backboard (32) and the display device (12).

This configuration makes it possible to replace the control unit (30) by simply performing insertion and removal of the control unit (30) relative to the slot (36) of the housing (22), whereby it is possible to improve the maintenance performance of the control unit (30).

The controller (10) is attached to the back face (18) of the display device (12) with the bottom face (24) of the housing (22) opposed against the back face (18) of the display device (12), and the slot (36) is formed in a side face (33) of the housing (22).

Accordingly, the control unit (30) can be easily inserted into and removed from the slot (36) without interfering with the display device (12), so that it is possible to further improve the maintenance performance of the control unit (30).

The controller (10) is attached to the back face (18) of the display device (12) with the bottom face (24) of the housing (22) opposed against the back face (18) of the display device (12), and the second connector (58) is provided close to the bottom face (24) of the housing (22).

This makes it easier to connect the second connector (58) to the first connector (60) when the controller (10) is attached to the back face (18) of the display device (12). Further, by connecting the first connector (60) and the second connector (58), it is possible to reliably attach the controller (10) to the back face (18) of the display device (12).

The second connector (58) is attached to the backboard (32).

This makes it possible to directly connect the first connector (60) to the second connector (58) without using cables, screws or the like and enables easy connection and disconnection between the first connector (60) and the second connector (58).

The plurality of slots (36) are formed in the housing (22), the control unit (30) includes the plurality of control boards (168) to be inserted into the plurality of slots (36), and the plurality of junctions (56) are provided to establish electric connection between each of the plurality of control boards (168) inserted into the plurality of slots (36) and the backboard (32).

As a result, the backboard (32) can integrate electrical connection of the plural control boards (168) with the display device (12). This configuration further facilitates connection and disconnection (or reconnection) of the controller (10) with the display device (12), thereby improving the maintenance performance of the plural control boards (168).

Each of the junctions (56) includes a third connector (44) attached to the control board (168) and a fourth connector (54) attached to the backboard (32) so as to be connected to the third connector (44), and the attachment positions of the plurality of third connectors (44) relative to the control boards (168) are configured to differ from each other when the third connectors (44) are viewed from the direction of insertion of the control boards (168).

In this manner, by shifting the attachment position of the third connector (44) on each control board (168), wrong connection of each control board (168) to the backboard (32) can be prevented. In other words, it is possible to prevent erroneous connection of the third connector (44) of each control board (168) to the fourth connector (54) which is different from the fourth connector (54) of the mating control board (168).

The openings (34) of the plurality of slots (36) are configured to be different in shape or size from each other, the cover (46) configured to close the opening (34) of the slot (36) for insertion is provided for each of the plurality of control boards (168) on the side opposite to the side close to the backboard (32), and each of the covers (46) provided for the plurality of control boards (168) has a shape or size corresponding to the opening (34) of the slot (36) into which the control board (168) is inserted.

Thus, it is possible to prevent erroneous insertion of the control board (168) into a wrong slot (36) other than the correct mating slot (36).

The present invention is not limited to the embodiments described above, and it goes without saying that the embodiments can be freely modified within a range that does not deviate from the essence and gist of the present invention as set forth in the appended claims.

What is claimed is:

1. A controller which is attached to a back face of a display device, comprising:
    a housing that is attached to the back face of the display device;
    a plurality of slots formed in a direction along the back face of the display device in the housing from an opening formed on a side face of the housing adjacent to a bottom face of the housing that is attached to the back face of the display device;
    a control unit, the control unit being accommodated in slots formed in the housing in a manner that the control unit is insertable into and removable from the slots in the direction along the back face of the display device, and the control unit being configured to control the display device;
    a backboard being provided inside the housing on an interior side with respect to a direction of insertion of the control unit, the backboard being connected to the control unit and being approximately perpendicular to the back face of the display device; and
    a second connector attached to a face of the backboard that is on a reverse side of the backboard with respect to the control unit, the second connector being connected to a first connector that is (a) provided for the back face of the display device and (b) separated from the backboard, whereby establishing connection between the backboard and the display device.

2. The controller according to claim 1, wherein:
    the second connector is provided close to the bottom face of the housing.

3. The controller according to claim 1,
    wherein
    the housing is formed with the plurality of slots,
    the control unit includes a plurality of control boards that is inserted into the plurality of slots,
    a plurality of junctions is provided to establish electric connection between the backboard and each of the plurality of control boards inserted into the plurality of slots.

4. The controller according to claim 3,
    wherein
    each of the plurality of junctions includes a third connector attached to a respective one of the control boards and a fourth connector attached to the backboard so as to be connected to the respective third connector; and attachment positions of the plurality of third connectors relative to the control boards are configured to differ from each other when the third connectors are viewed from a direction of insertion of the control boards.

5. The controller according to claim 3, wherein:

openings of the plurality of slots are configured to be different in shape or size from each other;

a cover configured to close the opening of the slot for insertion is provided for each of the plurality of control boards on a side opposite to a side close to the backboard; and each of the covers provided for the plurality of control boards has a shape or size corresponding to the opening of the slot into which the control board is inserted.

* * * * *